(12) United States Patent
Baek et al.

(10) Patent No.: US 11,004,860 B2
(45) Date of Patent: May 11, 2021

(54) NON-VOLATILE MEMORY DEVICE AND METHOD FOR FABRICATING THE SAME

(71) Applicant: Samsung Electronics Co., Ltd., Suwon-si (KR)

(72) Inventors: Seok Cheon Baek, Hwaseong-si (KR); Geun Won Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 144 days.

(21) Appl. No.: 16/733,539

(22) Filed: Jan. 3, 2020

(65) Prior Publication Data

US 2020/0144281 A1 May 7, 2020

Related U.S. Application Data

(63) Continuation of application No. 16/206,035, filed on Nov. 30, 2018.

(30) Foreign Application Priority Data

Jun. 8, 2018 (KR) .................. 10-2018-0065886

(51) Int. Cl.
*H01L 27/11575* (2017.01)
*H01L 27/11524* (2017.01)
*H01L 27/11556* (2017.01)
*H01L 27/11529* (2017.01)
*H01L 27/11548* (2017.01)
*H01L 27/1157* (2017.01)
*H01L 21/768* (2006.01)
*H01L 27/11573* (2017.01)
*H01L 23/535* (2006.01)
*H01L 27/11582* (2017.01)
*H01L 21/28* (2006.01)

(52) U.S. Cl.
CPC .. *H01L 27/11575* (2013.01); *H01L 21/76805* (2013.01); *H01L 21/76895* (2013.01); *H01L 23/535* (2013.01); *H01L 27/1157* (2013.01); *H01L 27/11524* (2013.01); *H01L 27/11529* (2013.01); *H01L 27/11548* (2013.01); *H01L 27/11556* (2013.01); *H01L 27/11573* (2013.01); *H01L 27/11582* (2013.01); *H01L 29/40114* (2019.08); *H01L 29/40117* (2019.08)

(58) Field of Classification Search
CPC .................................. H01L 27/11575
See application file for complete search history.

(56) References Cited

U.S. PATENT DOCUMENTS

| | | | |
|---|---|---|---|
| 7,679,133 B2 | 3/2010 | Son et al. |
| 8,338,882 B2 | 12/2012 | Tanaka et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,293,172 B2 | 3/2016 | Lee et al. |

(Continued)

FOREIGN PATENT DOCUMENTS

| | | |
|---|---|---|
| KR | 10-1087476 B1 | 11/2011 |
| KR | 10-2014-0010830 A | 1/2014 |
| KR | 10-2016-0069903 A | 6/2016 |

*Primary Examiner* — Marvin Payen
(74) *Attorney, Agent, or Firm* — Harness, Dickey & Pierce, P.L.C.

(57) ABSTRACT

A method for fabricating a non-volatile memory device is provided. The method includes forming a channel hole and a first contact hole simultaneously, several times, in order to achieve a desired a high aspect ratio.

20 Claims, 48 Drawing Sheets

(56) References Cited

U.S. PATENT DOCUMENTS

| | | |
|---|---|---|
| 9,627,399 B2 | 4/2017 | Kanakamedala et al. |
| 9,741,733 B2 | 8/2017 | Lim et al. |
| 10,038,009 B2 | 7/2018 | Lim et al. |
| 2011/0233648 A1 | 9/2011 | Seol et al. |
| 2016/0163726 A1 | 6/2016 | Tanzawa |
| 2017/0352678 A1 | 12/2017 | Lu et al. |

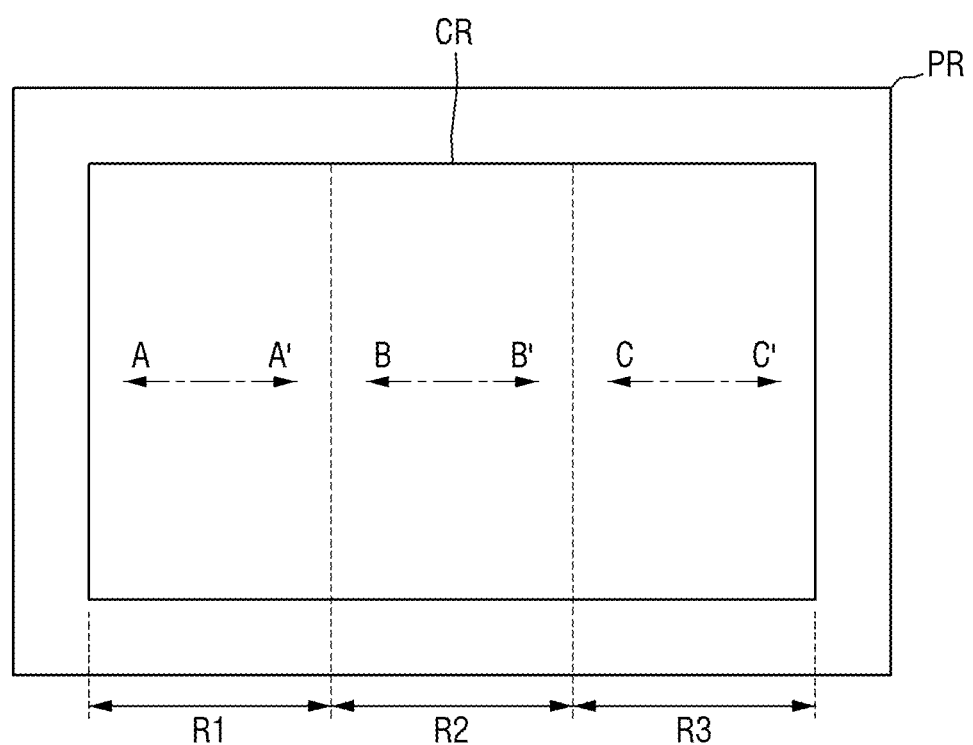

NON-VOLATILE MEMORY DEVICE AND METHOD FOR FABRICATING THE SAME

This application is a continuation of U.S. application Ser. No. 16/206,035 filed on Nov. 30, 2018, which claims priority from Korean Patent Application No. 10-2018-0065886 filed on Jun. 8, 2018 in the Korean Intellectual Property Office, the disclosure of each of which is incorporated herein by reference in their entirety.

BACKGROUND

1. Field of the Inventive Concepts

The present inventive concepts relate to a non-volatile memory device and a method for fabricating the same.

2. Description of the Related Art

A semiconductor memory device is a memory device which may be implemented, using semiconductors such as silicon (Si), germanium (Ge), gallium arsenide (GaAs), and indium phosphide (InP). Semiconductor memory devices are roughly divided into a volatile memory device and a non-volatile memory device. The volatile memory device is a memory device in which stored data is lost when a power supply is cut off. The volatile memory device includes SRAM (Static RAM), DRAM (Dynamic RAM), SDRAM (Synchronous DRAM), and the like. The non-volatile memory device is a memory device that holds the stored data even when the power supply is cut off. The non-volatile memory device includes a flash memory device, a ROM (Read Only Memory), a PROM (Programmable ROM), an EPROM (Electrically Programmable ROM), an EEPROM (Electrically Erasable and Programmable ROM), a resistive memory device (e.g., a PRAM (Phase-change RAM), a FRAM (Ferroelectric RAM), a RRAM (Resistive RAM)), and the like. Meanwhile, the degree of integration of the non-volatile memory device is increasing in order to satisfy the increased performance and/or lower price required by consumers. In the case of a two-dimensional or planar memory device, the degree of integration is determined by an area occupied by the unit memory cells. Therefore, recently, a three-dimensional memory device in which the unit memory cells are vertically arranged has been developed.

SUMMARY

Aspects of the present inventive concepts provide a non-volatile memory device capable of simplifying a fabricating process of a non-volatile memory device by simultaneously forming a channel hole and a contact hole, and a method for fabricating the same.

The aspects of the present inventive concepts are not restricted those mentioned above and another aspect which is not mentioned can be clearly understood by those skilled in the art from the description below.

According to some embodiments of the present inventive concepts, there is provided a method for fabricating a non-volatile memory device, the method comprising, providing a peripheral circuit region which includes a peripheral transistor on a lower substrate and a lower connection wiring electrically connected to the peripheral transistor, forming a first mold layer, in which first and second sacrificial layers are alternately stacked, on an upper substrate on the peripheral circuit region, forming a second mold layer on a base layer on the peripheral circuit region, forming a first channel hole which penetrates the first mold layer to expose the upper substrate, forming a first contact hole which penetrates the second mold layer and the base layer and extends inside of the peripheral circuit region to expose the lower connection wiring, forming a channel extending perpendicularly to the upper substrate in the first channel hole, filling the first contact hole with a contact material to form a contact, forming a trench spaced apart from the channel and penetrates the first mold layer to expose the upper substrate, removing the second sacrificial layer exposed by the trench and between the channel and the trench to form a recess and forming a gate electrode on the recess, wherein the first channel hole and the first contact hole are simultaneously formed.

According to some embodiments of the present inventive concepts, there is provided a method for fabricating a non-volatile memory device, the method comprising providing a peripheral circuit region which includes a peripheral transistor provided on a first substrate and a connection wiring connected to the peripheral transistor, forming a first mold layer, in which first and second sacrificial layers are alternately stacked, on a second substrate, forming a channel hole which exposes the second substrate through the first mold layer, forming a contact hole which exposes the connection wiring in the peripheral circuit region, filling the channel hole with a channel material to form a channel extending perpendicularly to the second substrate, filling the contact hole with a contact material to form a contact, forming a trench spaced apart from the channel and penetrates the first mold layer to expose the second substrate, removing the second sacrificial layer exposed by the trench and between the channel and the trench to form a recess and forming a gate electrode on the recess, wherein the channel hole and the contact hole are formed at the same time, and the contact electrically connects the gate electrode and the connection wiring.

According to some embodiments of the present inventive concepts, there is provided a method for fabricating a non-volatile memory device, the method comprising, providing a peripheral circuit region which includes a peripheral transistor provided on a lower substrate and a lower connection wiring electrically connected to the peripheral transistor, forming a first mold layer, in which first and second sacrificial layers are alternately stacked, on an upper substrate on the peripheral circuit region, forming a channel hole which penetrates the first mold layer to expose the upper substrate, forming a contact hole spaced apart from the channel hole, penetrates the first mold layer and the upper substrate, extends into the peripheral circuit region to expose the lower connection wiring, filling the channel hole with a channel material to form a channel extending perpendicularly with respect to the upper substrate, filing the contact hole with a contact material to form a contact, forming a trench which penetrates the first mold layer to expose the upper substrate between the channel and the contact, removing the second sacrificial level exposed by the trench and between the channel and the trench to form a recess and forming a gate electrode on the recess, wherein the channel hole and the contact hole are simultaneously formed.

BRIEF DESCRIPTION OF THE DRAWINGS

The above and other aspects and features of the present inventive concepts will become more apparent by describing in detail example embodiments thereof with reference to the attached drawings, in which:

FIG. 2 is a layout diagram illustrating the non-volatile memory device according to some embodiments of the technical idea of the present inventive concepts;

DETAILED DESCRIPTION OF EMBODIMENTS

In some embodiments of the present inventive concepts, a three-dimensional (3D) memory array is provided. The three-dimensional memory array may be monolithically formed on one or more physical levels of a memory cell array having circuitry associated with the operation of the memory cell and an active region formed on a silicon substrate. The associated circuitry may be formed inside the substrate or on the substrate. The term "monolithic" may mean a configuration in which a layer of each level of the array is directly placed on a layer of each lower level of the array.

In some embodiments of the present inventive concepts, the three-dimensional memory array may include 'a vertical NAND string' in which at least one memory cell is disposed on another memory cell and extends vertically. The at least one memory cell may include a charge trap layer. U.S. Pat. Nos. 7,679,133, 8,553,466, 8,654,587, 8,559,235 and U.S. Publication No. 2011/0233648, which are provided by reference, describe a suitable configuration of the three-dimensional memory arrays. The three-dimensional memory arrays may include bit lines and/or word lines shared between the levels, and a plurality of levels.

Hereinafter, a non-volatile memory device according to some embodiments of the technical idea of the present inventive concepts will be described with reference to FIGS. 1 to 4.

Figure 1:
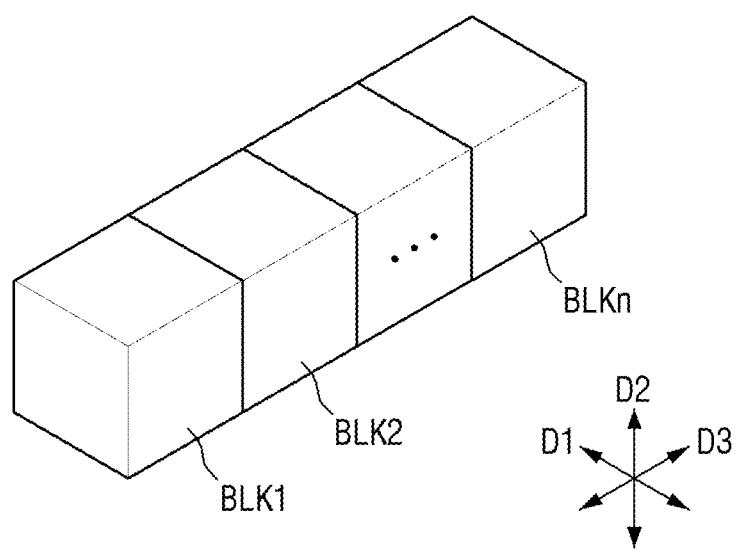
FIG. 1 is a conceptual diagram for explaining a non-volatile memory device according to some embodiments of the present inventive concepts.

FIG. 1 is a conceptual diagram for explaining the non-volatile memory device according to some embodiments of the present inventive concepts.

Referring to FIG. 1, the memory cell array of the non-volatile memory device according to some embodiments of the present inventive concepts may include a plurality of memory blocks (BLK1 to BLKn, where n is a natural number). Each of the memory blocks (BLK1 to BLKn) may extend in first to third directions (D1, D2 and D3). The first to third directions (D1, D2 and D3) are directions intersecting with each other, and may be directions different from each other as illustrated in the drawing. For example, the first to third directions (D1, D2 and D3) may be, but are not limited to, directions intersecting with each other at right angles.

Figure 3A:
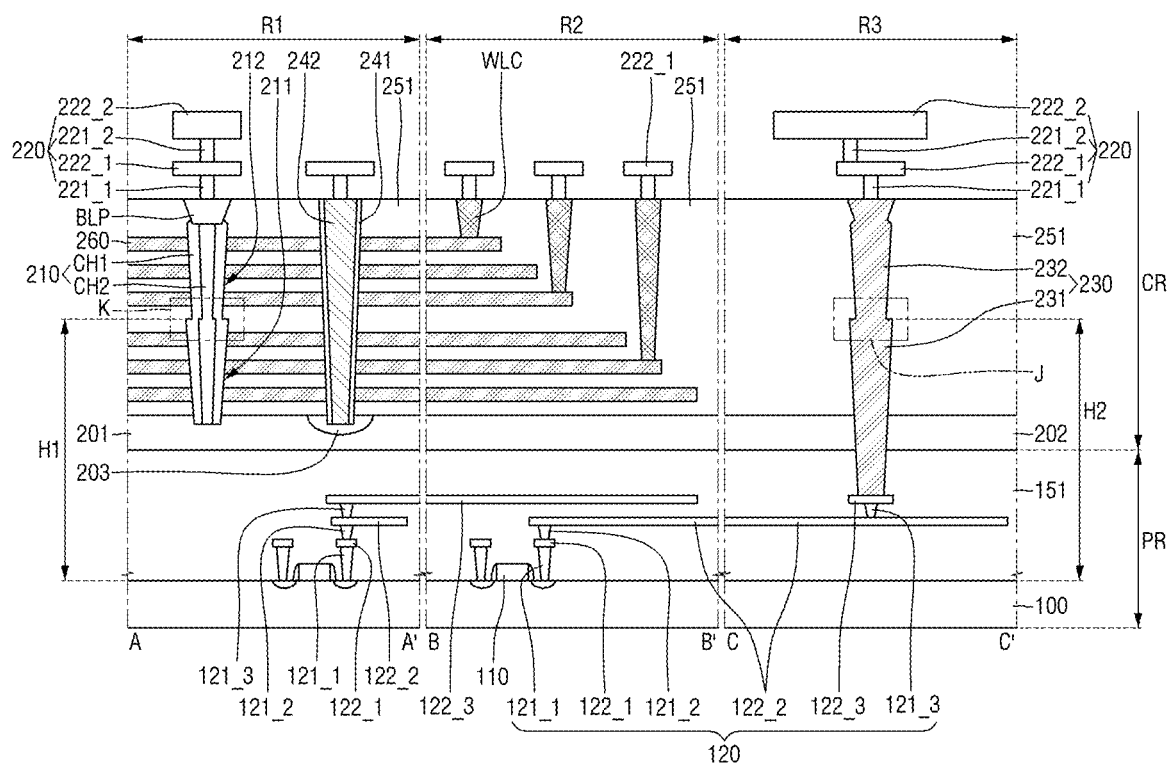
FIGS. 3a and 3b are cross-sectional views taken along lines A-A', B-B' and C-C' of FIG. 1.
Figure 3B:
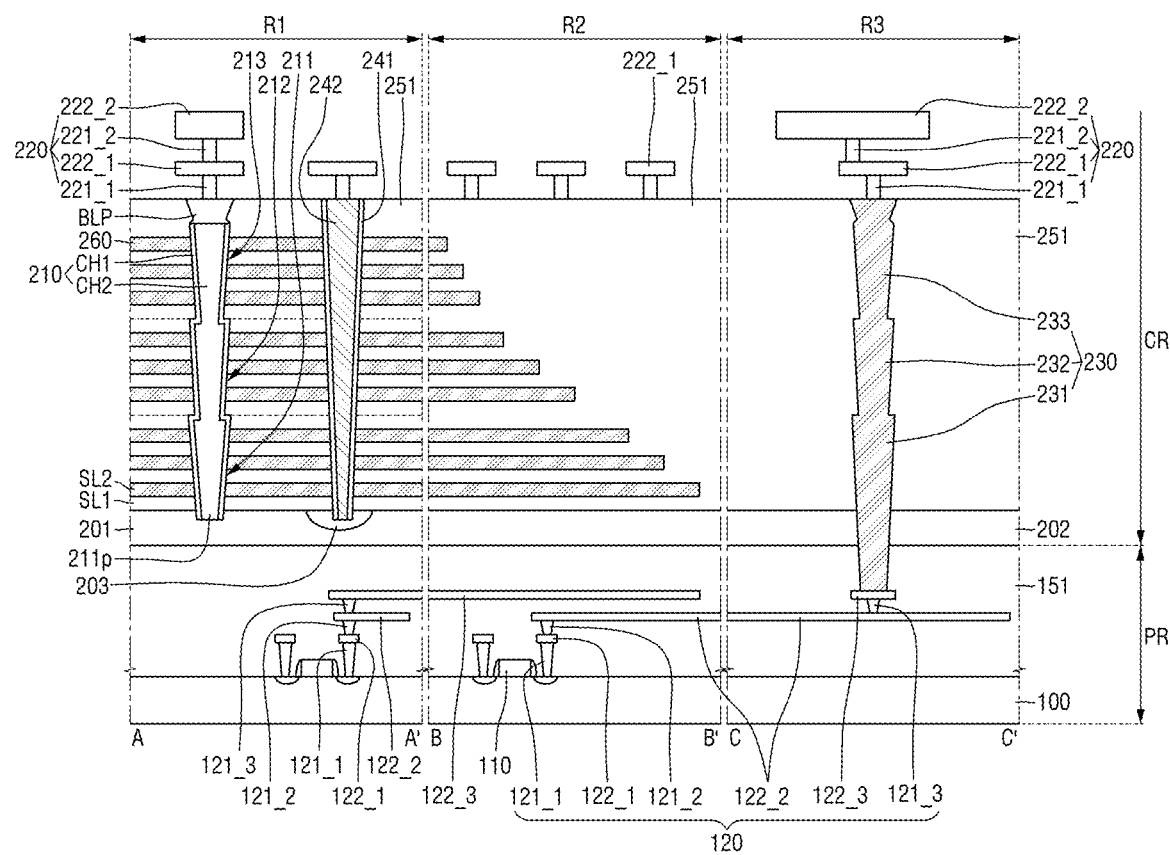
Figure 4A:
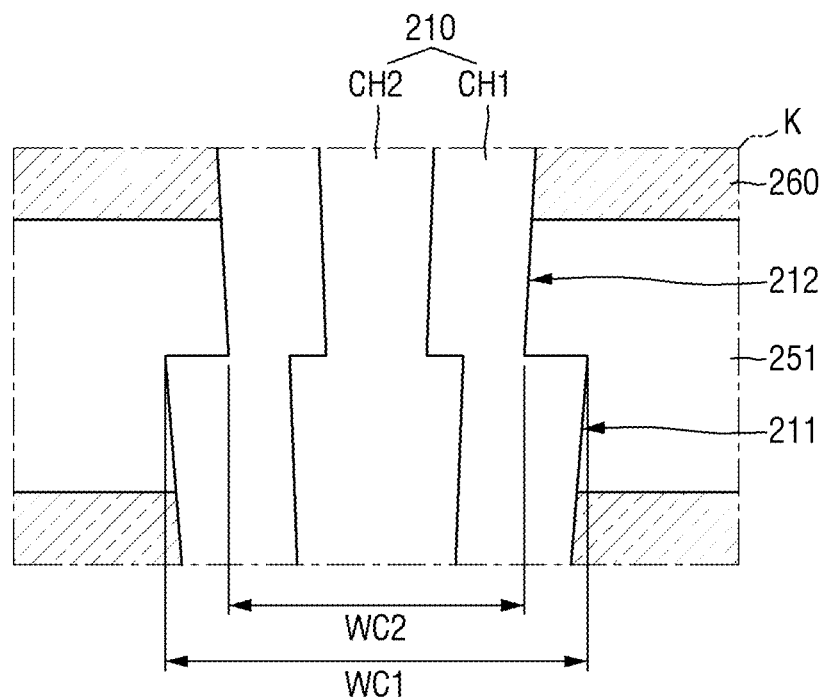
FIG. 4a is an enlarged view of a region K of FIG. 3A.
Figure 4B:
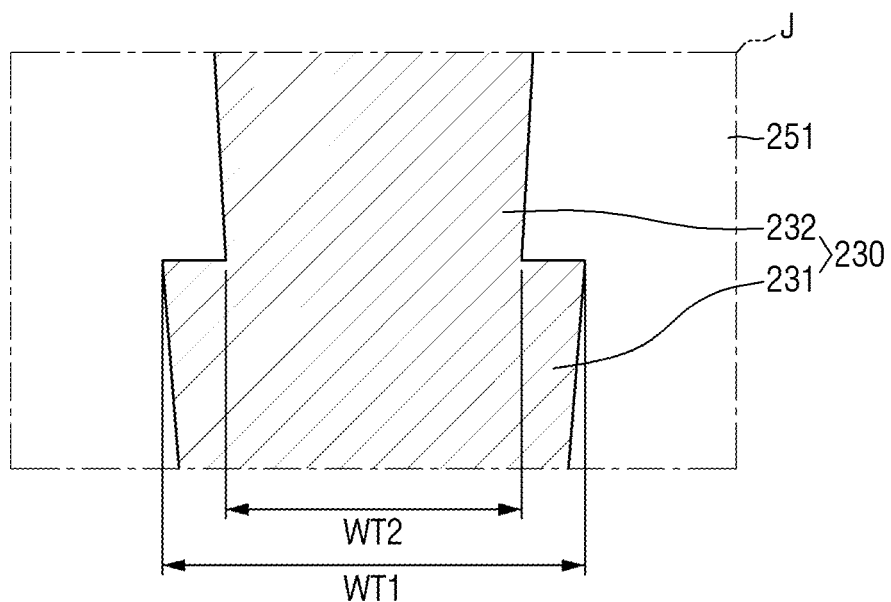
FIG. 4b is an enlarged view of a region J of FIG. 3A.

FIG. 2 is a layout diagram illustrating the non-volatile memory device according to some embodiments of the technical idea of the present inventive concepts. FIGS. 3a and 3b are cross-sectional views taken along lines A-A', B-B' and C-C' of FIG. 1. FIG. 4a is an enlarged view of a region K of FIG. 3A. FIG. 4b is an enlarged view of a region J of FIG. 3A.

Referring to FIG. 2, the non-volatile memory device according to some embodiments of the technical idea of the present inventive concepts may include a peripheral circuit region (PR), a first region R1, a second region R2 and/or a third region R3. The first region R1, the second region R2, and/or the third region R3 may be regions disposed on the peripheral circuit region (PR).

The first region R1 may be a cell array region in which multiple non-volatile memory cell arrays are arranged. The second region R2 may be a region in which a multiple vertical wirings, a multiple pads, and the like are arranged for routing the multiple stacked electrodes (e.g., word lines). The third region R3 may be a region in which at least one contact (e.g., a contact 230 of FIG. 3a) for connecting an upper connection wiring 220 of FIG. 3a and a connection wiring (e.g., a lower connection wiring 120 of FIG. 3a) of the peripheral circuit region (PR).

Referring to FIG. 3a, at least some parts of each of the peripheral circuit region (PR) and the first to third regions R1, R2 and R3 of the non-volatile memory device according to some embodiments of the technical idea of the present inventive concepts may vertically overlap one another.

The peripheral circuit region (PR) may include a first substrate 100, a peripheral transistor 110 and a lower connection wiring 120.

The first substrate 100 may be, for example, bulk silicon or silicon-on-insulator (SOI). Alternatively, the first substrate 100 may be a silicon substrate or may include other materials, for example, silicon germanium, indium antimonide, lead tellurium compound, indium arsenide, indium phosphide, gallium arsenide or gallium antimonide. Alternatively, the first substrate 100 may have an epitaxial level formed on the base substrate.

The peripheral transistor 110 may be provided in the first substrate 100. The lower connection wiring 120 may be electrically connected to the peripheral transistor 110. The peripheral transistor 110 may be electrically connected to the upper connection wiring 220 via the lower connection wiring 120 and the contact 230.

The lower connection wiring 120 may include first, second and/or third lower contacts 121_1, 121_2 and 121_3, and first, second and/or third lower connection wirings 122_1, 122_2 and 122_3 disposed on the first substrate 100. The first lower contact 121_1 may connect the peripheral transistor 110 and the first lower connection wiring 122_1.

The second lower contact 121_2 may connect the first lower connection wiring 122_1 and the second lower connection wiring 122_2. The second lower connection wiring 122_2 may extend, for example, from the second region R2 to the third region R3. The third lower contact 121_3 may connect the second lower connection wiring 122_2 and the third lower connection wiring 122_3.

The first interlayer insulating layer 151 may cover the peripheral transistor 110 and the lower connection wiring 120. The first interlayer insulating layer 151 may include, for example, at least one of a low dielectric constant material, an oxide layer, a nitride layer, and an oxynitride layer. The low dielectric constant material may include, but is not limited to, for example, FOX (Flowable Oxide), TOSZ (Tonen Sila7ene), USG (Undoped Silicate Glass), BSG (Borosilicate Glass), PSG (PhosphoSilicate Glass), BPSG (Boro Phospho Silicate Glass), PETEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD) or a combination thereof.

The first region R1 may include a second substrate 201, a channel 210, a conductive line 242, a gate electrode 260, and/or a bit line pad (BLP). The second region R2 may include a word line contact (WLC). The third region R3 may include a contact 230 and/or a base layer 202.

The second substrate 201 may be disposed on the peripheral circuit region (PR). The second substrate 201 may be disposed on the first substrate 100. The second substrate 201 may extend, for example, from the first region R1 to the second region R2. The second substrate 201 may be, for example, bulk silicon or silicon-on-insulator (SOI). Alternatively, the second substrate 201 may be a silicon substrate, or include other materials, for example, silicon germanium, indium antimonide, lead tellurium compound, indium arsenide, indium phosphide, gallium arsenide or gallium antimonide. Alternatively, the second substrate 201 may have an epitaxial level formed on the base substrate.

In some embodiments, the second substrate 201 may not extend to the third region R3. When the second substrate 201 does not extend to the third region R3, the base layer 202 may be disposed in the third region R3. The base layer 202 may be disposed on the peripheral circuit region (PR). The base layer 202 may include, for example, an oxide.

The base layer 202 may be arranged, for example, in the second substrate 201 to penetrate the second substrate 201. For example, the base layer 202 may be formed after removal of a part of the second substrate 201 on which the contact 230 is disposed.

The second substrate 201 may include an impurity region 203 provided to a common source line. The conductive line 242 may extend perpendicularly to the second substrate 201. A part of the conductive line 242 may extend, for example, into an impurity region 203. An insulating layer 241 of the conductive line may wrap the conductive line 242. The conductive line 242 may be connected to the first upper connection wiring 222_1 via, for example, the first upper contact 221_1.

The conductive line 242 may include a conductive material. The conductive line 242 may include, for example, tungsten. The conductive line 242 is connected to the impurity region 203 of the second substrate 201 and may operate as a common source line. The insulating layer 241 of the conductive line may include an insulating material that may insulate the conductive line 242, the gate electrode 260 and the like.

The channel 210 extends perpendicularly to the second substrate 201 and may be arranged in a line pattern. The channel 210 may be disposed to be spaced apart from the conductive line 242. The channel 210 may be disposed on the second substrate 201 in the form of a pillar. A part of the channel 210 may extend, for example, into the second substrate 201. However, the technical idea of the present inventive concepts is not limited thereto. For example, a part of the channel 210 may not extend into the second substrate 201.

The channel 210 may include a first channel level CH1 and a second channel level CH2. The first channel level CH1 may wrap the second channel level CH2. The first channel level CH1 may include, for example, a channel insulating level and a surface level. The channel insulating level may include, for example, a tunneling insulating layer, a charge storage layer, and a blocking insulating layer.

For example, the tunneling insulating layer may allow charge to pass between the surface level and the charge storage layer. The charge storage layer, for example, may store charges having passed through the tunneling insulating layer between the blocking insulating layer and the tunneling insulating layer. The blocking insulating layer may reduce or prevent, for example, the electric charge captured by the charge storage layer from being discharged to the gate electrode 260. The surface level is disposed between the channel insulating level and the second channel level CH2 and may operate as a channel region. The surface level may provide a charge trapped or discharged by the channel insulating level.

The second channel level CH2 may include an insulating material. The channel 210 may include a first channel part 211 and a second channel part 212. The second channel part 212 may be arranged on the first channel part 211. The first channel part 211 may include a lower part of the first channel level CH1, and a lower part of the second channel level CH2. The second channel part 212 may include an upper part of the first channel level CH1, and an upper part of the second channel level CH2.

Referring to FIG. 4a, a width WC1 of the first channel part 211 and a width WC2 of the second channel part 212 may be different from each other at a boundary between the first channel part 211 and the second channel part 212. The width WC1 of the first channel part 211 may be greater than the width WC2 of the second channel part 212.

Referring again to FIG. 3a, a single channel 210 is illustrated in the drawings, but it is a matter of course that the non-volatile memory device may further include a plurality of channels spaced apart from each other.

The bit line pad (BLP) is disposed on the channel 210 and may connect the channel 210 and the first upper contact 221_1. The channel 210 may be connected to the first upper connection wiring 222_1 via the bit line pad (BLP) and the first upper contact 221_1. Further, the channel 210 may be connected to the second upper connection wiring 222_2 via the first upper connection wiring 222_1 and the second upper contact 221_2.

The gate electrode 260 may be disposed between the conductive line 242 and the channel 210. The gate electrode 260 may intersect with the channel 210 and the conductive line 242. A plurality of gate electrodes 260 may be vertically stacked on the second substrate 201. For example, the channel 210 and the conductive line 242 may penetrate through a structure in which the gate electrode 260 and the second interlayer insulating layer 251 are sequentially stacked.

The gate electrode 260 may include a conductive material. The gate electrode 260 may include a conductive material such as tungsten (W), cobalt (Co) and nickel (Ni), or a semiconductor material such as silicon, but the present inventive concepts are not limited thereto. The gate electrode 260 need not be a single layer, and in the case of a multilayer structure, the gate electrode 260 may further include a conductive material and an insulating material different from each other. The gate electrode 260 may operate as a word line. For example, in the plurality of gate electrodes 260, each of the gate electrodes 260 stacked vertically may operate as word lines different from each other.

The word line contact (WLC) may be arranged in the second region R2. The word line contact (WLC) may extend vertically from the gate electrode 260. The word line contact (WLC) may connect the first upper contact 221_1 and the gate electrode 260. The gate electrode 260 may be connected to the first upper connection wiring 222_1 via the word line contact (WLC) and the first upper contact 221_1.

Three word line contacts (WLC) are illustrated on the six gate electrodes 260 in the drawings, but the technical idea of the present inventive concepts is not limited thereto. For example, the word line contact (WLC) may be disposed on each gate electrode 260.

The word line contact (WLC) may be disposed, for example, at a distal end of the gate electrode 260. Any one of the plurality of gate electrodes 260 may be arranged to expose another distal end of the plurality of gate electrodes 260 located just below. In other words, the distal ends of the plurality of gate electrodes 260 may have a step shape in the second region R2. The word line contact (WLC) may be disposed on the other distal end of the plurality of gate electrodes 260 exposed by any one of the plurality of gate electrodes 260.

The second interlayer insulating layer 251 may be disposed between the plurality of gate electrodes 260, and between the conductive line 242 and the channel 210. The second interlayer insulating layer 251 may cover the gate electrode 260, the second substrate 201, and/or the base layer 202. The second interlayer insulating layer 251 may cover the channel 210, the bit line pad (BLP), the conductive line 242, the word line contact (WLC) and/or the contact 230.

The second interlayer insulating layer 251 may include, for example, at least one of a low dielectric constant material, an oxide layer, a nitride layer, and an oxynitride layer. The second interlayer insulating layer 251 may include, for example, the same material as a first sacrificial layer (SL1 of FIG. 11) to be described later, but is not limited thereto.

The contact 230 may be disposed in the third region R3. The contact 230 may mutually connect the upper connection wiring 220 and the lower connection wiring 120. The contact 230 may be disposed to be spaced apart from the channel 210, the conductive line 242 and the word line contact (WLC). The contact 230 may pass through the second interlayer insulating layer 251, the base layer 202, and the first interlayer insulating layer 151. For example, the contact 230 may extend from the upper surface of the second interlayer insulating layer 251 to the upper surface of the lower connection wiring 120 (e.g., the third lower connection wiring 122_3).

The contact 230 may include a first contact part 231 and a second contact part 232. The second contact part 232 may be disposed on the first contact part 231.

Referring to FIG. 4b, at the boundary between the first contact part 231 and the second contact part 232, a width WT1 of the first contact part 231 and a width WT2 of the second contact part 232 may be different from each other. The width WT1 of the first contact part 231 may be greater than the width WT2 of the second contact part 232.

Referring again to FIG. 3a, on the basis of the upper surface of the first substrate 100, a height to the boundary between the first channel part 211 and the second channel part 212 may be a first height H1. Also, on the basis of the upper surface of the first substrate 100, a height to the boundary between the first contact part 231 and the second contact part 232 may be a second height H2. The first height H1 may be, for example, the same as the second height H2. In other words, the boundary between the first channel part 211 and the second channel part 212 may be located on the same plane as the boundary between the first contact part 231 and the second contact part 232.

Although FIG. 3a illustrates a configuration in which each of the channel 210 and the contact 230 includes two portions that vary in width, the technical idea of the present inventive concepts is not limited thereto. Referring to FIG. 3b, each of the channel 210 and the contact 230 may include a plurality of portions that varies in width. For example, the channel 210 may further include a third channel part 213 on the second channel part 212. At the boundary between the second channel part 212 and the third channel part 213, a width WC2 of the second channel part 212 and a width of the third channel part 213 may be different from each other. Further, for example, the contact 230 may further include a third contact part 233 on the second contact part 232. The width WT2 of the second contact part 232 and the width of the third contact part 233 may be different from each other at the boundary between the second contact part 232 and the third contact part 233. In some embodiments, on the basis of the upper surface of the first substrate 100, the height to the boundary between the second channel part 212 and the third channel part 213 may be the same as the height to the boundary between the second contact part 232 and the third contact part 233. In other words, the boundary between the second channel part 212 and the third channel part 213, and the boundary between the second contact part 232 and the third contact part 233 may be located on the same plane.

Since the non-volatile memory device according to some embodiments of the technical idea of the present inventive concepts forms a first channel hole (CHH1 of FIG. 12) for forming the first channel part 211 and a second channel hole (TH1 of FIG. 12) for forming the first contact part 231 at the same time in the fabricating process, the first height H1 and the second height H2 may be the same. Detailed descriptions thereof will be provided later.

The non-volatile memory device according to some embodiments of the technical idea of the present inventive concepts may include a portion which varies in width, by forming the channel hole (CHH of FIG. 16) and the contact hole (TH of FIG. 18) several times, when forming the channel 210 and the contact 230. For example, after simultaneously forming the first channel hole (CHH1 of FIG. 12) in which the first channel part 211 is formed and the first contact hole (TH1 of FIG. 12) in which the first contact part 231 is formed, the second channel hole (CHH2 of FIG. 14) in which the second channel part 212 is formed and the second contact hole (TH2 of FIG. 14) in which the second contact part 232 may be formed at the same time. In the case of forming the channel hole (CHH of FIG. 16) and the contact hole (TH of FIG. 18) several times, it is possible to solve a problem in which the channel hole (CHH of FIG. 16) and the contact hole (TH of FIG. 18) are not be formed to the desired depth due to a higher aspect ratio. Detailed description thereof will be provided later.

The upper connection wiring 220 may be electrically connected to the non-volatile memory cell array. The non-volatile memory cell array is disposed in the first region R1, and may include a gate electrode 260, a channel 210, a conductive line 242, and/or the like. The upper connection wiring 220 may be electrically connected to the lower connection wiring 120 via the contact 230. For example, the third lower connection wiring 122_3 may be connected to the first upper connection wiring 222_1 via the contact 230 and the first upper contact 221_1. For example, the contact 230 may electrically connect the gate electrode 260 and the lower connection wiring 120. The first upper connection wiring 222_1 may be connected to the second upper connection wiring 222_2 via the second upper contact 221_2.

In the drawings, each of the lower connection wiring 120 and the upper connection wiring 220 has a specific number of contacts and wirings, but the technical idea of the present inventive concepts is not limited thereto. For example, it is a matter of course that each of the lower connection wiring 120 and the upper connection wiring 220 may have an arbitrary number of contacts and wirings as required.

Hereinafter, the non-volatile memory device according to some embodiments of the technical idea of the present inventive concepts will be described with reference to FIGS. 2 and 5. For the sake of clarity of explanation, the repeated part of the aforementioned description will be simplified or omitted.

Figure 5:
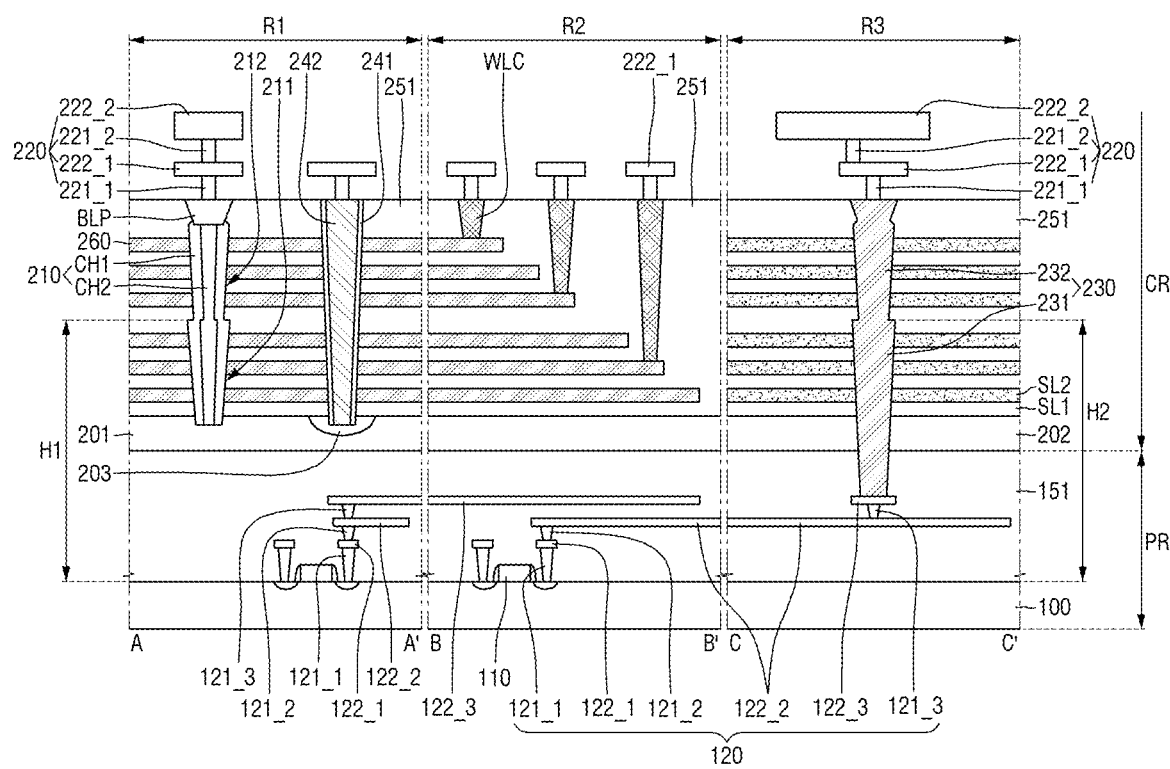
FIG. 5 is a cross-sectional view taken along lines A-A', B-B' and C-C' of FIG. 1.

FIG. 5 is a cross-sectional view taken along lines A-A', B-B' and C-C' of FIG. 1.

Referring to FIG. 5, the contact 230 may be disposed in the second interlayer insulating layer 251, the first sacrificial layer SL1, and the second sacrificial layer SL2. For example, the first contact part 231 may be disposed in the first sacrificial layer SL1 and the second sacrificial layer SL2. For example, a part of the second contact part 232 may be disposed in the first sacrificial layer SL1 and the second sacrificial layer SL2, and the remaining part of the second contact part 232 may be disposed in the second interlayer insulating layer 251. The first sacrificial layer SL1 may include, for example, an oxide. The first sacrificial layer SL1 may include the same material as the second interlayer insulating layer 251, but is not limited thereto. The second sacrificial layer SL2 may include, for example, silicon nitride.

In the drawings, each of the channel 210 and the contact 230 are illustrated as including two portions with varying widths, but the technical idea of the present inventive concepts is not limited thereto. For example, each of the channels 210 and contacts 230 may include a plurality of portions that varies in width. For example, the channel 210 may further include a third channel part on the second channel part 212, and the width of the second channel part 212 and the width of the third channel part may be different from each other at the boundary between the second channel part 212 and the third channel part. Furthermore, for example, the contact 230 may further include a third contact part on the second contact part 232, and the width WT2 of the contact part 232 and the width of the third contact part may be different from each other at the boundary between the second contact part 232 and the third contact par.

Hereinafter, the non-volatile memory device according to some embodiments of the technical idea of the present inventive concepts will be described with reference to FIGS. 2 and 6. For the sake of clarity of explanation, the repeated part of the aforementioned description will be simplified or omitted.

Figure 6:
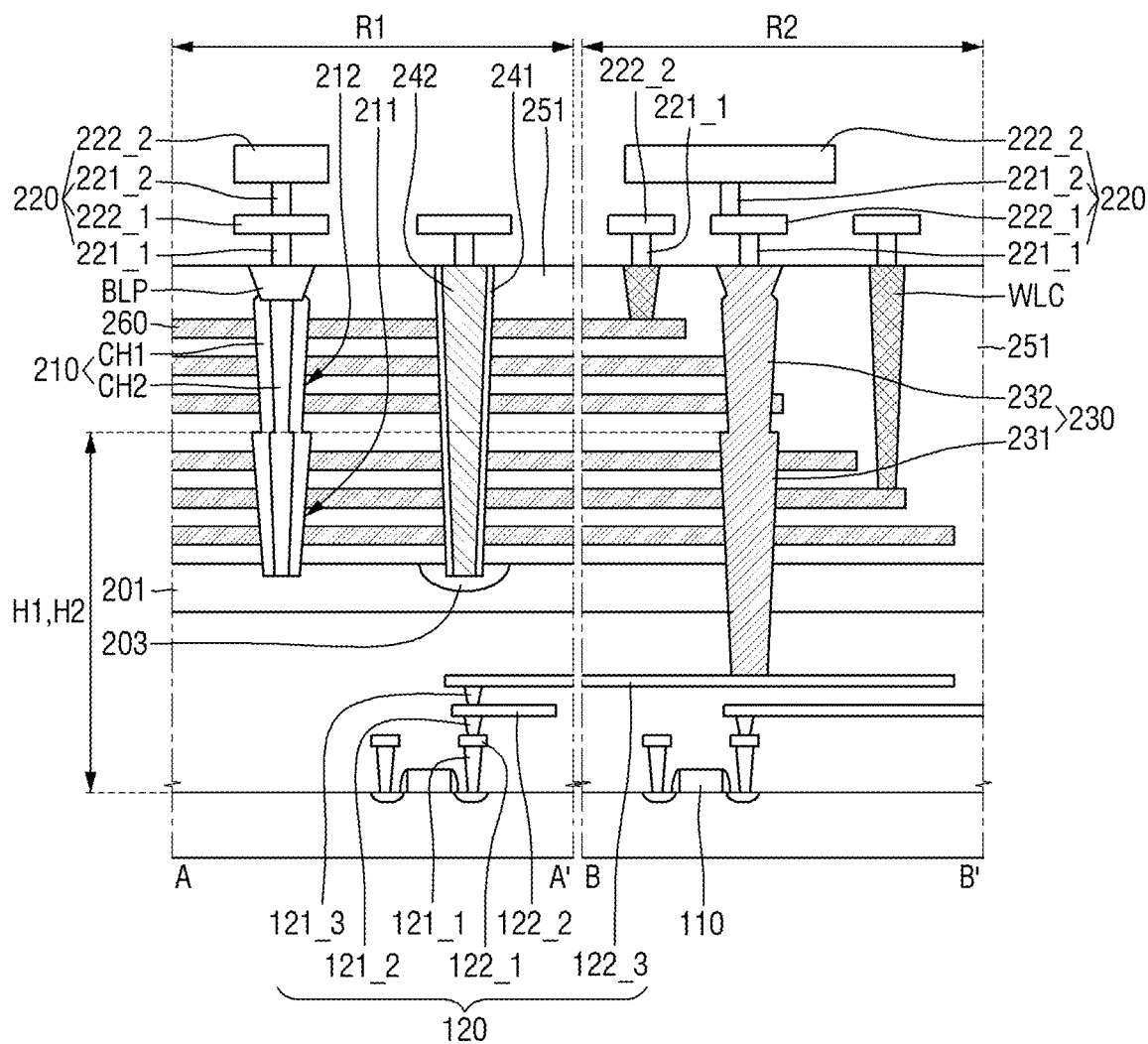
FIG. 6 is a cross-sectional view taken along lines A-A' and B-B' of FIG. 2.

FIG. 6 is a cross-sectional view taken along line A-A' and line B-B' of FIG. 2.

Referring to FIGS. 2 and 6, the contact 230 may be disposed in the second region R2. The contact 230 may be disposed between the word line contacts (WLC). The contact 230 penetrates the plurality of gate electrodes 260, the second interlayer insulating layer 251, the second substrate 201 and/or the first interlayer insulating layer 151, and may be connected to the lower connection wiring 120. For example, the contact 230 penetrates the multiple gate electrodes 260, the second interlayer insulating layer 251, the second substrate 201 and the first interlayer insulating layer 151 from the upper surface of the second interlayer insulating layer 251, and may extend to the upper surface of the third lower connection wiring 122_3.

Hereinafter, the non-volatile memory device according to some embodiments of the technical idea of the present inventive concepts will be described with reference to FIGS. 7 and 8. For the sake of clarity of explanation, the repeated part of the aforementioned description will be simplified or omitted.

Figure 7:
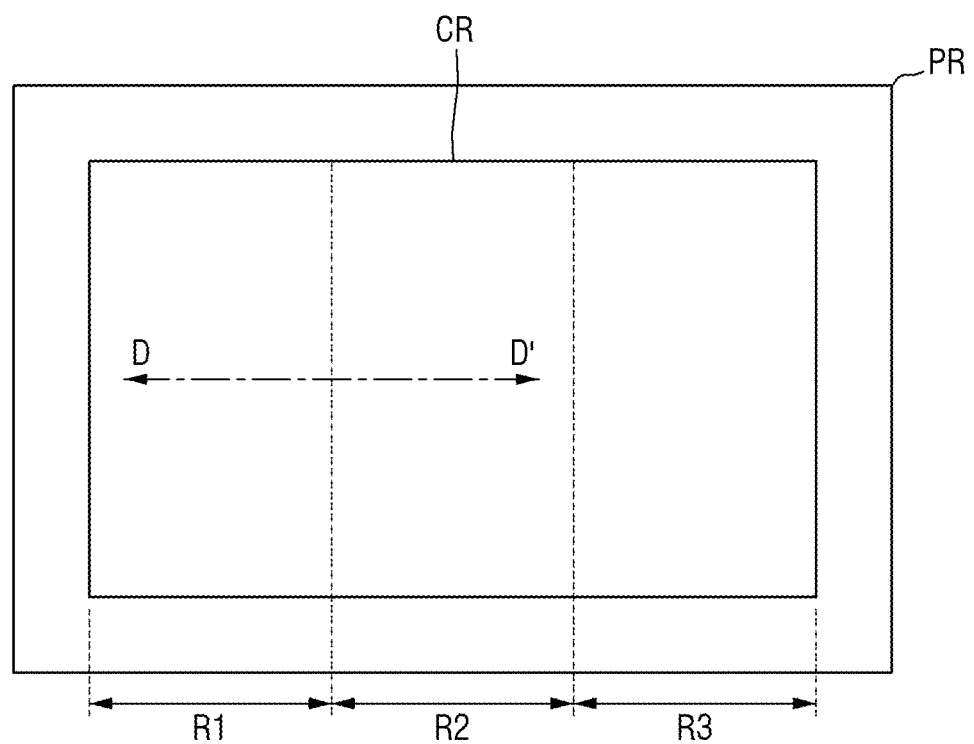
FIG. 7 is a layout diagram for explaining the non-volatile memory device according to some embodiments of the technical idea of the present inventive concepts.

FIG. 7 is a layout diagram for explaining the non-volatile memory device according to some embodiments of the technical idea of the present inventive concepts. FIG. 8 is a cross-sectional view taken along line D-D' of FIG. 7.

Figure 8:
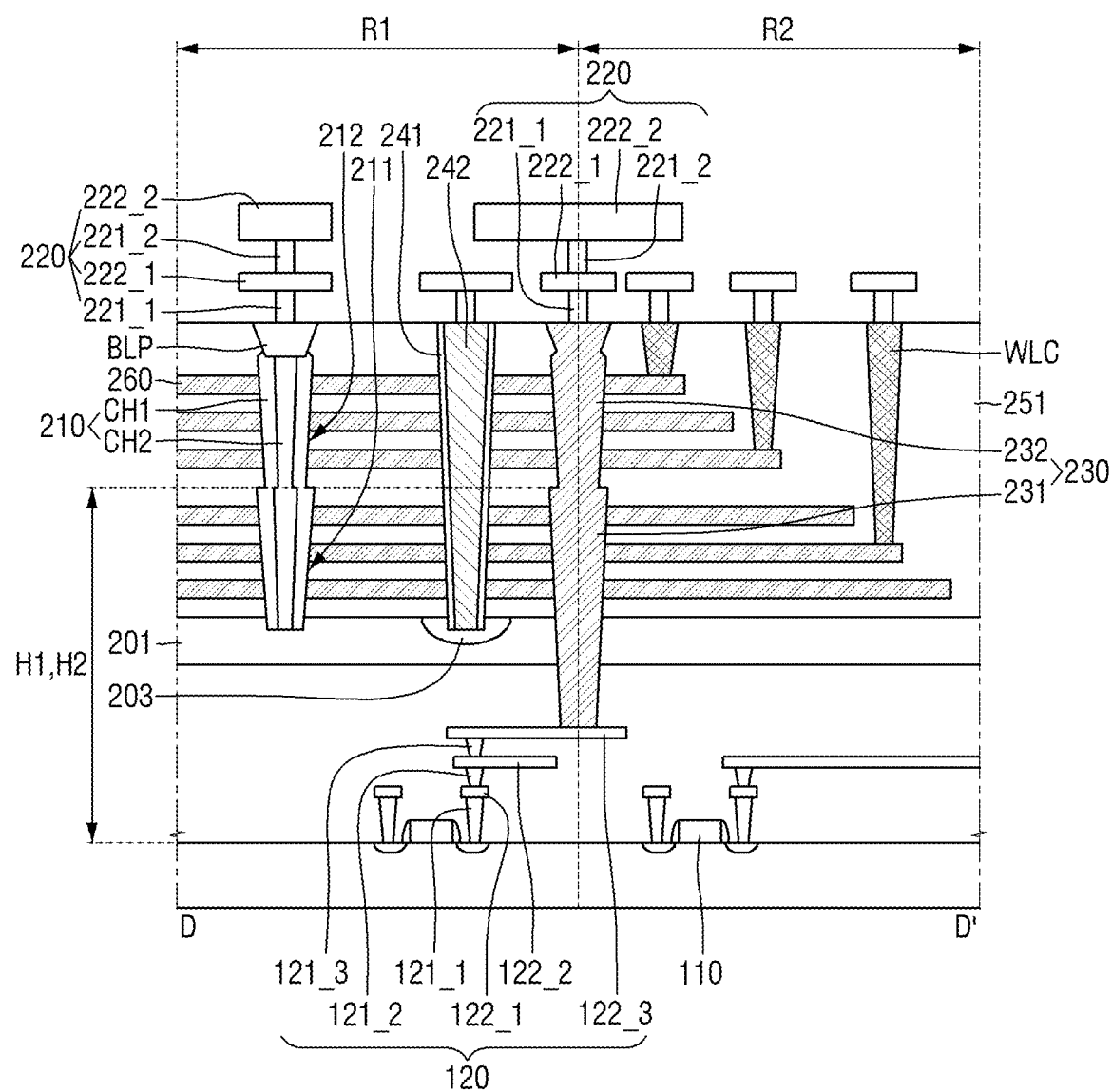
FIG. 8 is a cross-sectional view taken along line D-D' of FIG. 7.

Referring to FIGS. 7 and 8, the contact 230 may be disposed at the boundary between the first region R1 and the second region R2. The contact 230 may be disposed, for example, between the conductive line 242, the channel 210 and the word line contact (WLC). The contact 230 may mutually connect the upper connection wiring 220 and the lower connection wiring 120. The contact 230 penetrates the multiple gate electrodes 260, the second interlayer insulating layer 251, the second substrate 201 and/or the first interlayer insulating layer 151, and may extend to the third lower connection wiring 122_3 of the lower connection wiring 120.

Hereinafter, the non-volatile memory device according to some embodiments of the technical idea of the present inventive concepts will be described with reference to FIGS. 9 and 10. For the sake of clarity of explanation, the repeated part of the aforementioned description will be simplified or omitted.

Figure 9:
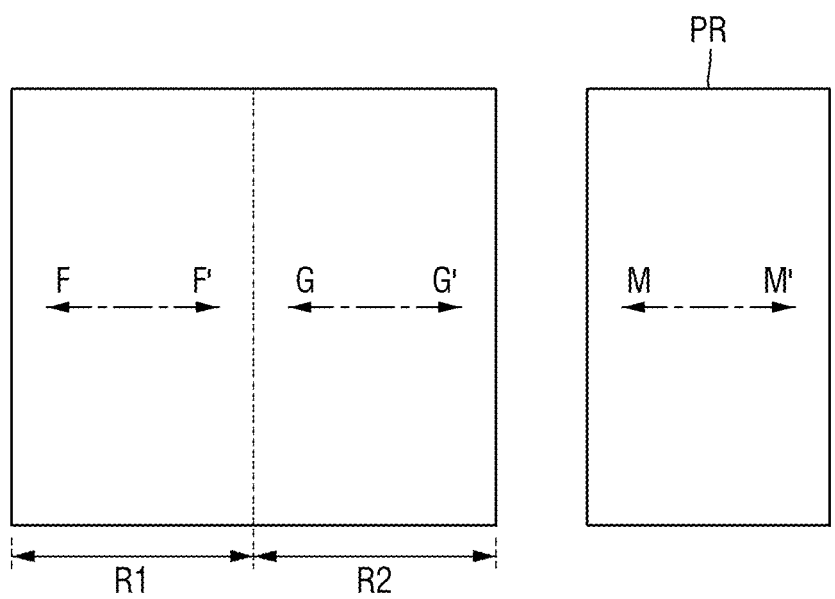
FIG. 9 is a layout diagram for explaining the non-volatile memory device according to some embodiments of the technical idea of the present inventive concepts.

FIG. 9 is a layout diagram for explaining the non-volatile memory device according to some embodiments of the technical idea of the present inventive concepts. FIG. 10 is a cross-sectional view taken along lines F-F', G-G', and M-M' of FIG. 9.

Referring to FIG. 9, the peripheral circuit region (PR) may not vertically overlap the first and second regions R1 and R2. The peripheral circuit region (PR) may be spaced apart from the first and second regions R1 and R2.

Figure 10:
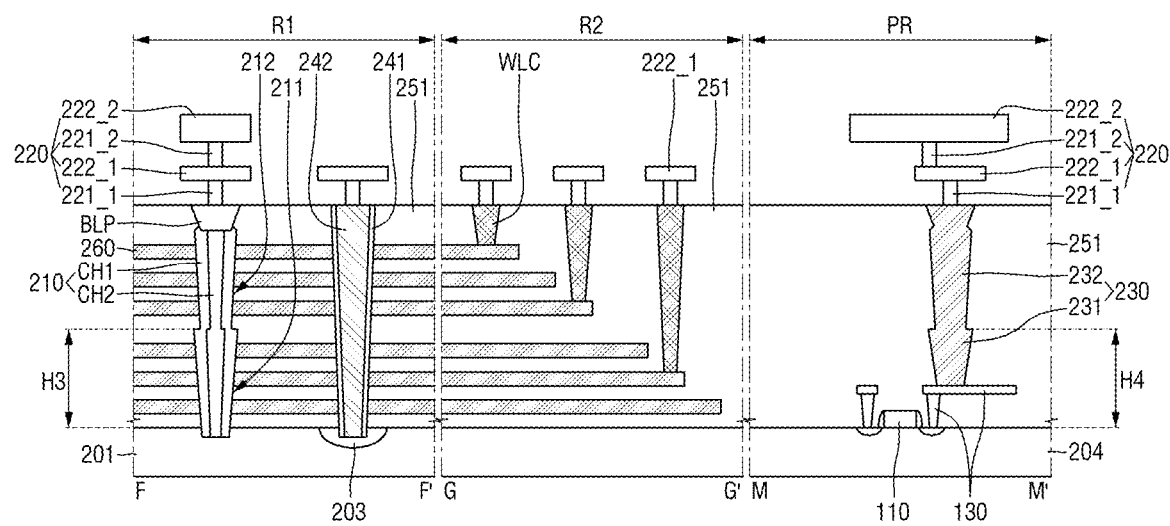
FIG. 10 is a cross-sectional view taken along lines F-F', G-G', and M-M' of FIG. 9.

Referring to FIG. 10, the third substrate 204 may not vertically overlap the first substrate 100. The third substrate 204 may be, for example, a part of the first substrate 100. In other words, the first substrate 100 may extend to the peripheral circuit region (PR) via the first region R1 and the second region R2. The portion of the first substrate 100 of the peripheral circuit region (PR) may be a third substrate 204.

The peripheral circuit region (PR) may include the peripheral transistor 110, the peripheral circuit connection wiring 130 and/or the contact 230. The peripheral transistor 110 may be provided on the third substrate 204. The peripheral circuit connection wiring 130 may connect the peripheral transistor 110 and the contact 230.

The contact 230 may connect the upper connection wiring 220 and the peripheral circuit connection wiring 130. The contact 230 may penetrate the second interlayer insulating layer 251 and extend from the upper surface of the second interlayer insulating layer 251 to the upper surface of the peripheral circuit connection wiring 130.

On the basis of the upper surface of the second substrate 201, a height to the boundary between the first channel part 211 and the second channel part 212 may be a third height H3. On the basis of the upper surface of the third substrate 204, a height to the boundary between the first contact part 231 and the second contact part 232 may be a fourth height H4. The third height H3 may be the same as, for example, the fourth height H4. In other words, the third height H3 may be located on the same plane as the fourth height H4.

Since the non-volatile memory device according to some embodiments of the technical idea of the present inventive concepts simultaneously form a channel hole for forming the first channel part 211 and a contact hole for forming the first contact part 231 in the fabricating process, the third height H3 and the fourth height H4 may be the same.

Hereinafter, a method for fabricating a non-volatile memory device according to some embodiments of the technical idea of the present inventive concepts will be described with reference to FIGS. 11 to 22b. For the sake of clarity of explanation, the repeated part of the aforementioned description will be simplified or omitted.

FIGS. 11 to 22b are intermediate stage diagrams for explaining the method for fabricating the non-volatile memory device according to some embodiments of the technical idea of the present inventive concepts.

Figure 11:
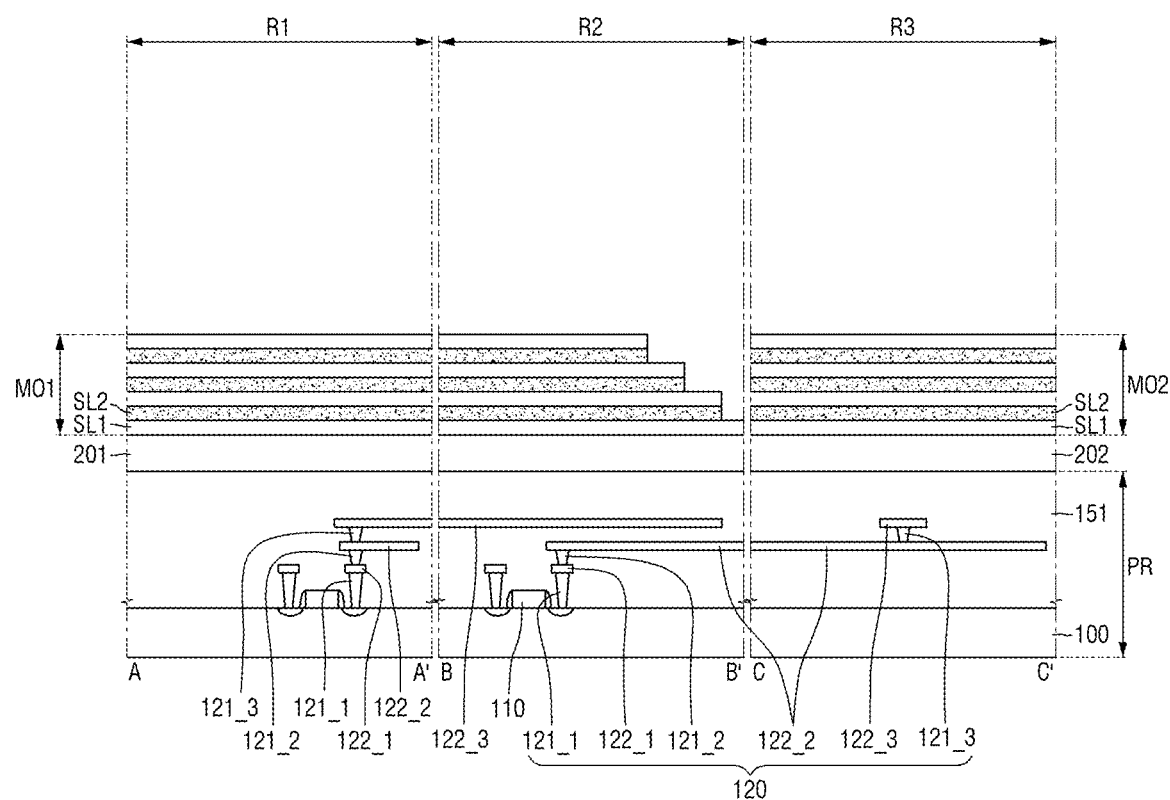
FIGS. 11 to 22b are intermediate stage diagrams for explaining a method for fabricating a non-volatile memory device according to some embodiments of the technical idea of the present inventive concepts.

Referring to FIG. 11, a peripheral circuit region (PR) including a peripheral transistor 110 provided on the first substrate 100 and a lower connection wiring 120 electrically connected to the peripheral transistor 110 may be provided.

A first mold layer MO1 may be formed in the first region R1 and the second region R2. The first mold layer MO1 may be formed on the second substrate 201. The first mold layer MO1 may be formed on the peripheral circuit region (PR). The first mold layer MO1 may include a first sacrificial layer SL1 and a second sacrificial layer SL2 alternately stacked.

The distal ends of the alternately stacked first and second sacrificial layers SL1 and SL2 formed in the second region R2 may form a step shape. For example, the second sacrificial layer SL2 formed on the first sacrificial layer SL1 may be formed to expose the distal end of the first sacrificial layer SL1.

The second mold layer MO2 may be formed in the third region R3. The second mold layer MO2 may be formed on the base layer 202. The second mold layer MO2 may be formed on the peripheral circuit region (PR). The second mold layer MO2 may include the first sacrificial layer SL1 and the second sacrificial layer SL2 which are alternately stacked.

Figure 12:
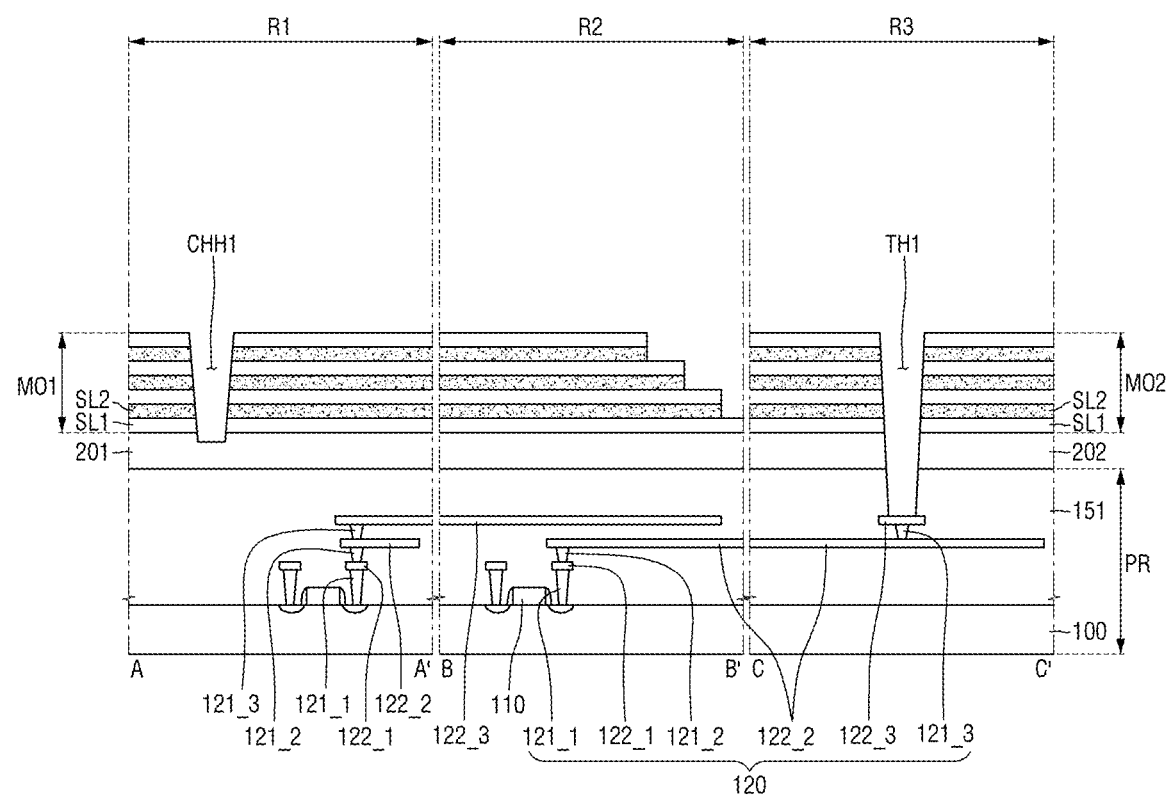

Referring to FIG. 12, a first channel hole CHH1 may be formed in the first mold layer MO1 formed in the first region R1. Further, a first contact hole TH1 may be formed in the second mold layer MO2 formed in the third region R3. The first channel hole CHH1 and the first contact hole TH1 may be formed at the same time, namely in the same process operation.

The first channel hole CHH1 may expose the second substrate 201 through the first mold layer MO1 formed in the first region R1. The first channel hole CHH1 may extend, for example, to a part of the second substrate 201. In other words, a first channel hole CHH1 may be formed in the second substrate 201.

The first contact hole TH1 may penetrate through the second mold layer MO2 and the base layer 202 formed in the third region R3. The first contact hole TH1 may extend to the inside of the peripheral circuit region (PR) to expose the lower connection wiring 120. For example, the first contact hole TH1 may penetrate the first interlayer insulating layer 151 of the peripheral circuit region (PR) to expose the upper surface of the third lower connection wiring 122_3.

In the drawings, the side wall of the first channel hole CHH1 and the side wall of the first contact hole TH1 are illustrated as having an arbitrary inclination on the basis of the upper surface of the second substrate 201. However, the technical idea of the present inventive concepts is not limited thereto. For example, the side wall of the first channel hole CHH1 and the side wall of the first contact hole TH1 may have a vertical inclination on the basis of the upper surface of the second substrate 201.

According to some embodiments of the technical idea of the present inventive concepts, the method for fabricating the non-volatile memory device may simplify the fabricating process of the non-volatile memory device, by forming the first channel hole CHH1 and the first contact hole TH1 at the same time, e.g. during the same process operation.

Figure 13:
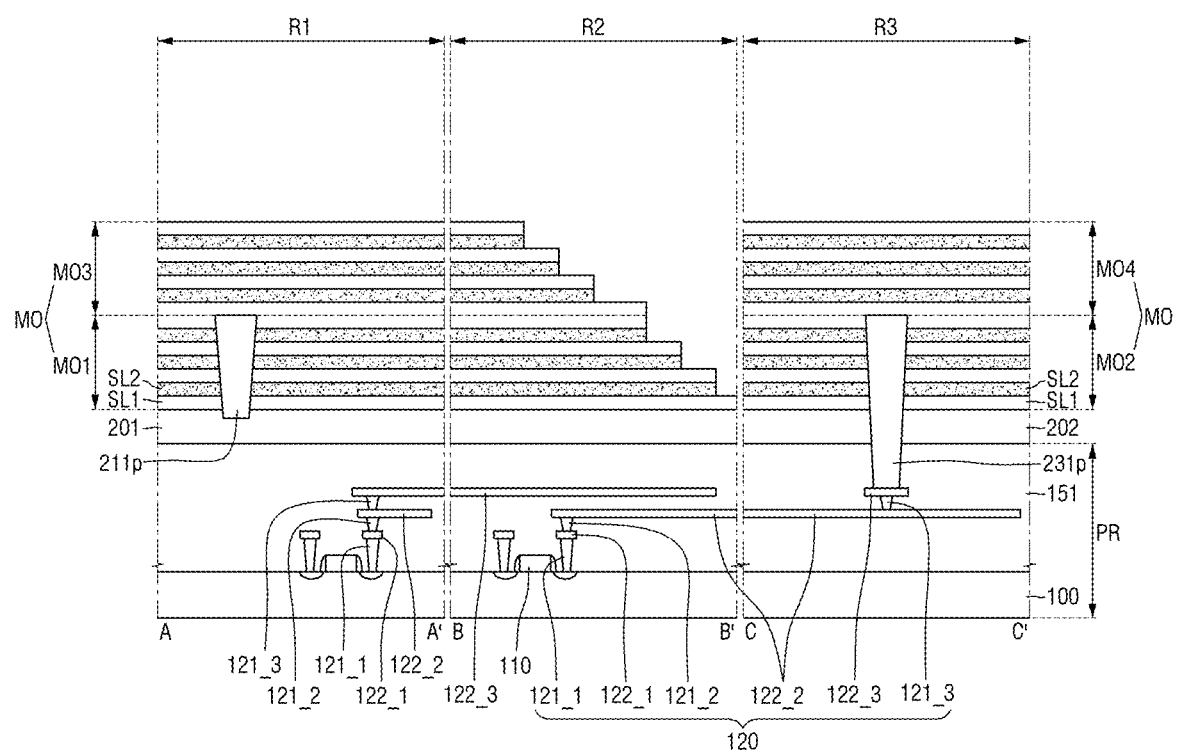

Referring to FIG. 13, a first pre channel part 211p and a first pre contact part 231p may be formed. The first pre channel part 211p may be formed by filling the first channel hole CHH1 with the first sacrificial channel material. In some embodiments, the first sacrificial channel material may be, for example, polysilicon. The first pre contact part 231p may be formed by filling the first contact hole TH1 with the first sacrificial contact material. In some embodiments, the first sacrificial contact material may be, for example, polysilicon.

A third mold layer MO3 may be formed on the first mold layer MO1 and the first pre channel part 211p of the first region R1. The third mold layer MO3 may include a first sacrificial layer SL1 and a second sacrificial layer SL2 that are alternately stacked. The third mold layer MO3 may also be formed on the first mold layer MO1 of the second region R2. The distal end of the third mold layer MO3 formed in the second region R2 may form a step shape. A fourth mold layer MO4 may be formed in the third region R3. The fourth mold layer MO4 may be formed on the second mold layer MO2 and the first pre contact part 231p. The fourth mold layer MO4 may include a first sacrificial layer SL1 and a second sacrificial layer SL2 that are alternately stacked. The mold layer MO of the first region R1 and the second region R2 may include first and third mold layers MO1 and MO3, and the mold layer MO of the third region R3 may include second and fourth mold layers MO2 and MO4.

Figure 14A:
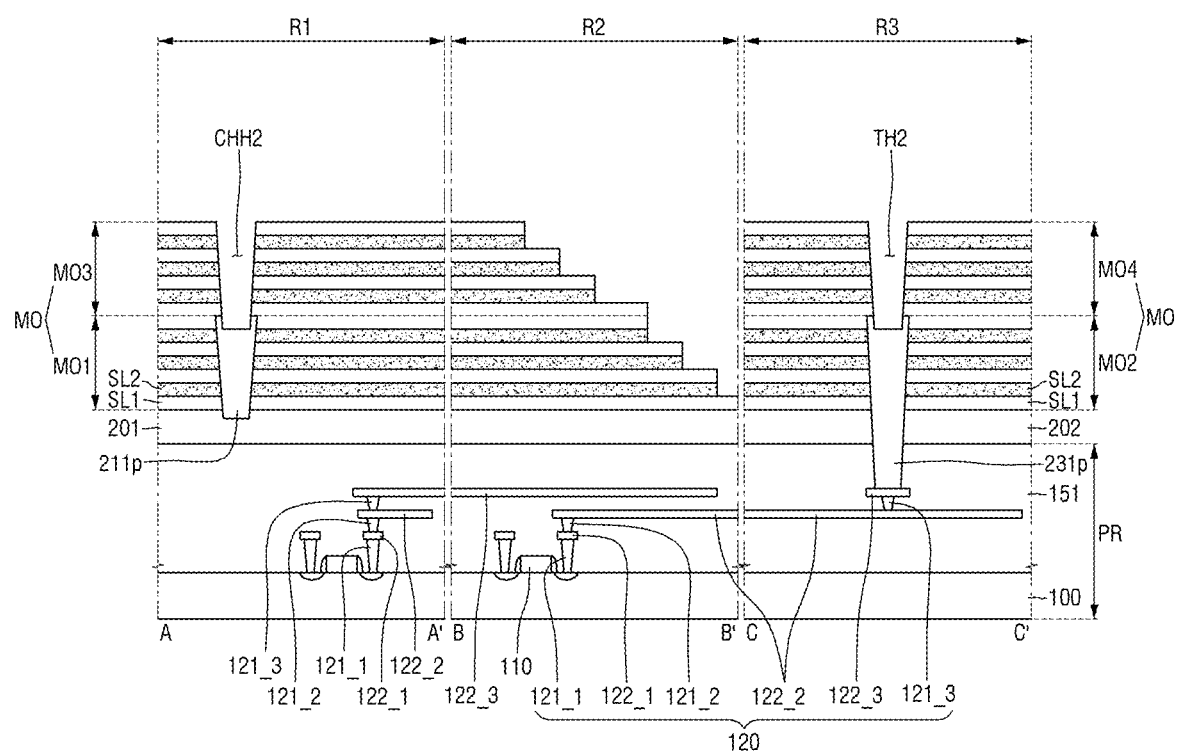

Referring to FIG. 14a, the second channel hole CHH2 may be formed in the mold layer MO of the first region R1. Furthermore, a second contact hole TH2 may be formed in the mold layer MO of the third region R3. The second channel hole CHH2 and the second contact hole TH2 may be formed at the same time, e.g. during the same process operation.

The second channel hole CHH2 may penetrate the mold layer MO of the first region R1 to expose the first pre channel part 211p. For example, the second channel hole CHH2 may extend to a part of the first pre channel part 211p. In other words, a part of the second channel hole CHH2 may be formed in the first pre channel part 211p.

The second contact hole TH2 may penetrate the mold layer MO of the third region R3 to expose the first pre contact part 231p. For example, the second contact hole TH2 may extend to a part of the first pre contact part 231p. In other words, a part of the second contact hole TH2 may be formed in the first pre contact part 231p.

Figure 14B:
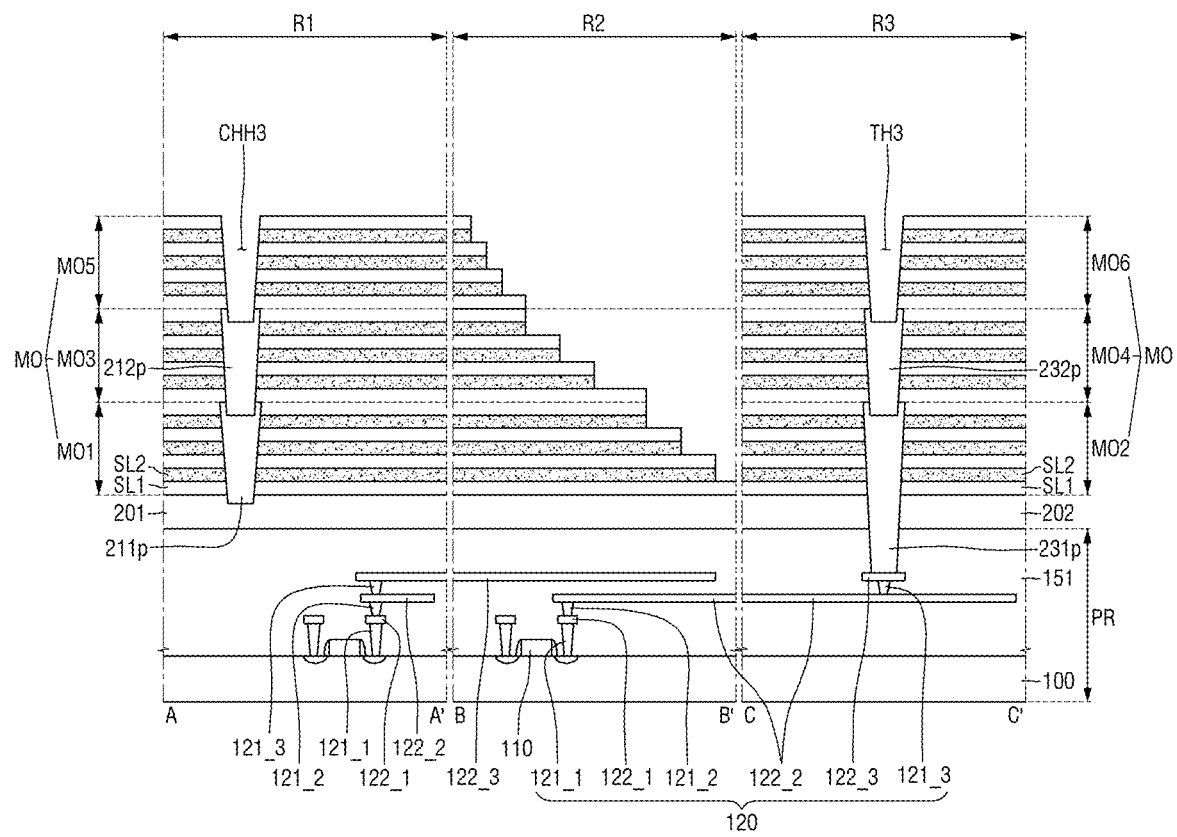

In some embodiments, a third channel hole CHH3 and a third contact hole TH3 may be formed on the second channel hole CHH2 and the second contact hole TH2, respectively. Referring to FIG. 14b, each of the second channel hole CHH2 and the second contact hole TH2 may be filled with the second sacrificial channel material and the second sacrificial contact material to form a second pre channel part 212p and a second pre contact part 232p. In some embodiments, the second sacrificial channel material and the second sacrificial contact material may be, for example, polysilicon. A fifth mold layer MO5 may be formed on the third mold layer MO3 and the second pre channel part 212p. A sixth mold layer MO6 may be formed on the fourth mold layer MO4 and the second pre contact part 232p. The fifth mold layer MO5 and the sixth mold layer MO6 may include a first sacrificial layer SL1 and a second sacrificial layer SL2 that are alternately stacked. The mold layer MO of the first and second regions R1 and R2 may further include a fifth mold layer MO5, and the mold layer MO of the third region R3 may further include a sixth mold layer MO6. A third channel hole CHH3 may be formed in the fifth mold layer MO5 formed in the first region R1. The third channel hole CHH3 may penetrate the fifth mold layer MO5 formed in the first region R1 to expose the second pre channel part 212p. The third contact hole TH3 may penetrate the sixth mold layer MO6 to expose the second pre contact part 232p. The third channel hole CHH3 and the third contact hole TH3 may be formed at the same time, e.g. during the same process operation.

According to some embodiments of the technical idea of the present inventive concepts, a method for fabricating a non-volatile memory device may simplify the fabricating process of the non-volatile memory device, by forming the second channel hole CHH2 and the second contact hole TH2 at the same time, e.g. during the same process operation. In some embodiments, the method for fabricating the non-volatile memory device according to some embodiments of the technical idea of the present inventive concepts may simplify the fabricating process of the non-volatile memory device, by forming the third channel hole CHH3 and the third contact hole TH3 at the same time, e.g. during the same process operation.

Figure 15A:
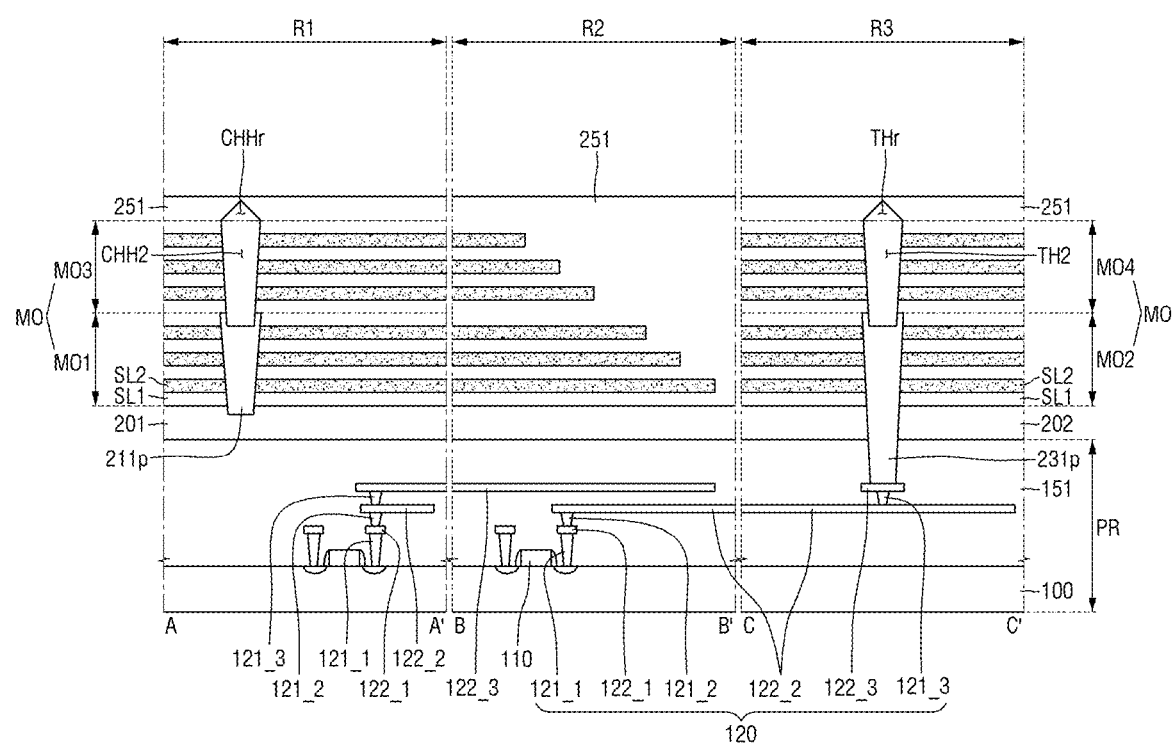
Figure 15B:
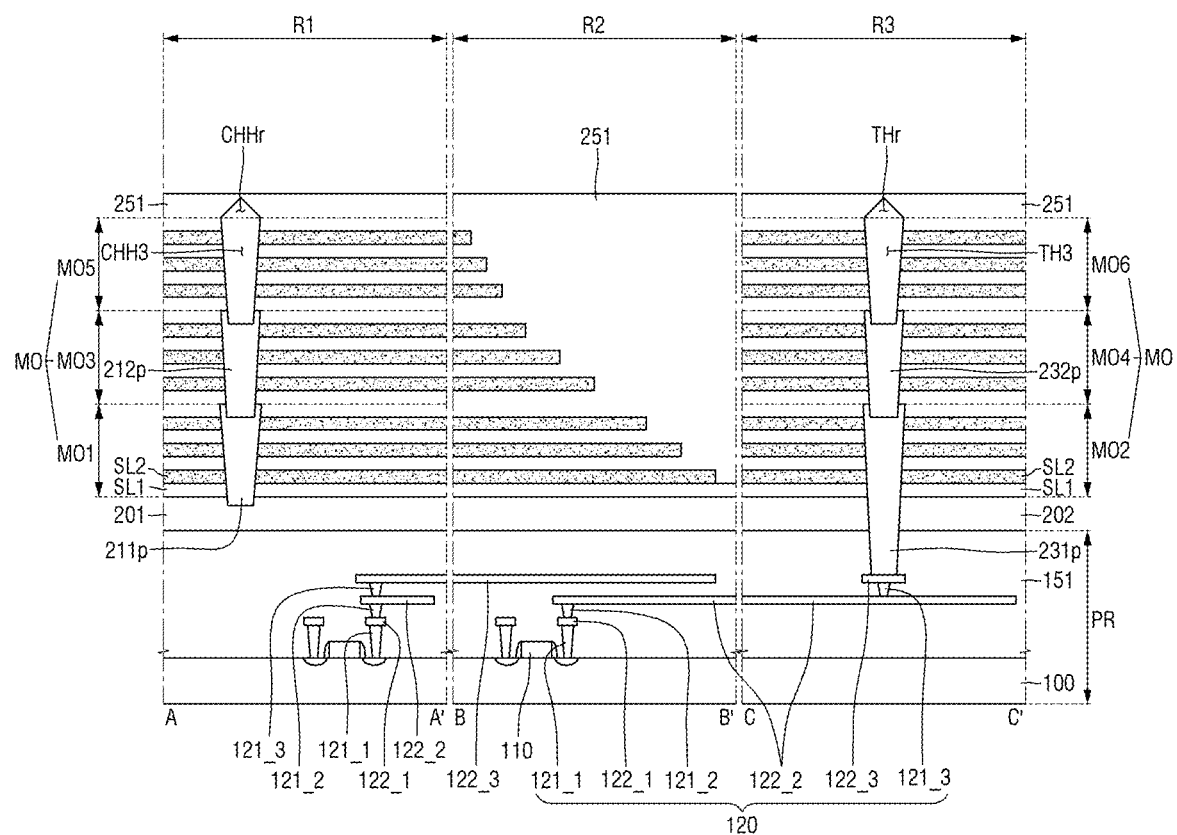

Referring to FIGS. 15a and 15b, a second interlayer insulating layer 251 may be formed on the second channel hole CHH2, the second contact hole TH2 and the mold layer MO. The second interlayer insulating layer 251 may include, for example, a material having poor gap fill characteristics. Therefore, the second interlayer insulating layer 251 does not fill the second channel hole CHH2 or the third channel hole CHH3 so that a channel hole recess CHHr may be formed. Further, the second interlayer insulating layer 251 may not fill the second contact hole TH2 or the third contact hole TH3 so that a contact hole recess THr may be formed.

The channel hole recess CHHr may be formed in the second interlayer insulating layer 251 formed on the mold layer MO of the first region R1. The contact hole recess THr may be formed in the second interlayer insulating layer 251 formed on the mold layer MO of the third region R3.

The second interlayer insulating layer 251 and the first sacrificial layer SL1 may include the same material, but the technical idea of the present inventive concepts is not limited thereto. For example, the second interlayer insulating layer 251 and the first sacrificial layer SL1 may include materials different from each other. When the second interlayer insulating layer 251 and the first sacrificial layer SL1 include the different materials, the first sacrificial layer SL1 and the second interlayer insulating layer 251 may be distinguished from each other.

Figure 16A:
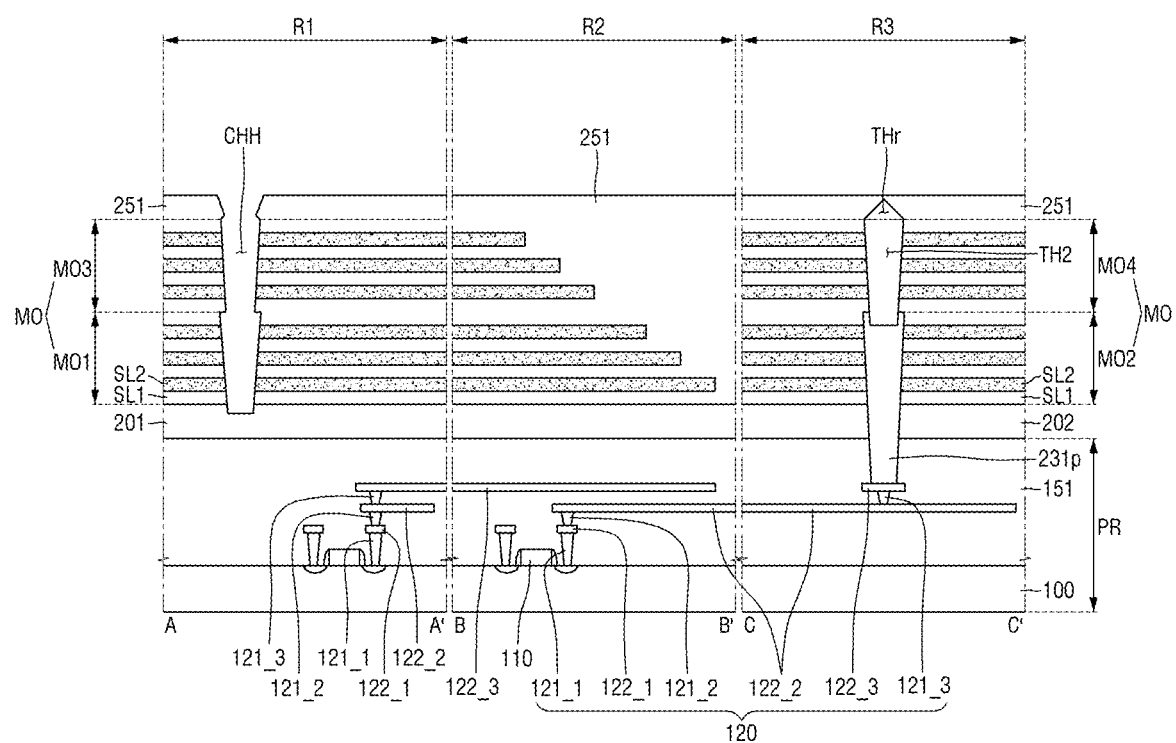
Figure 16B:
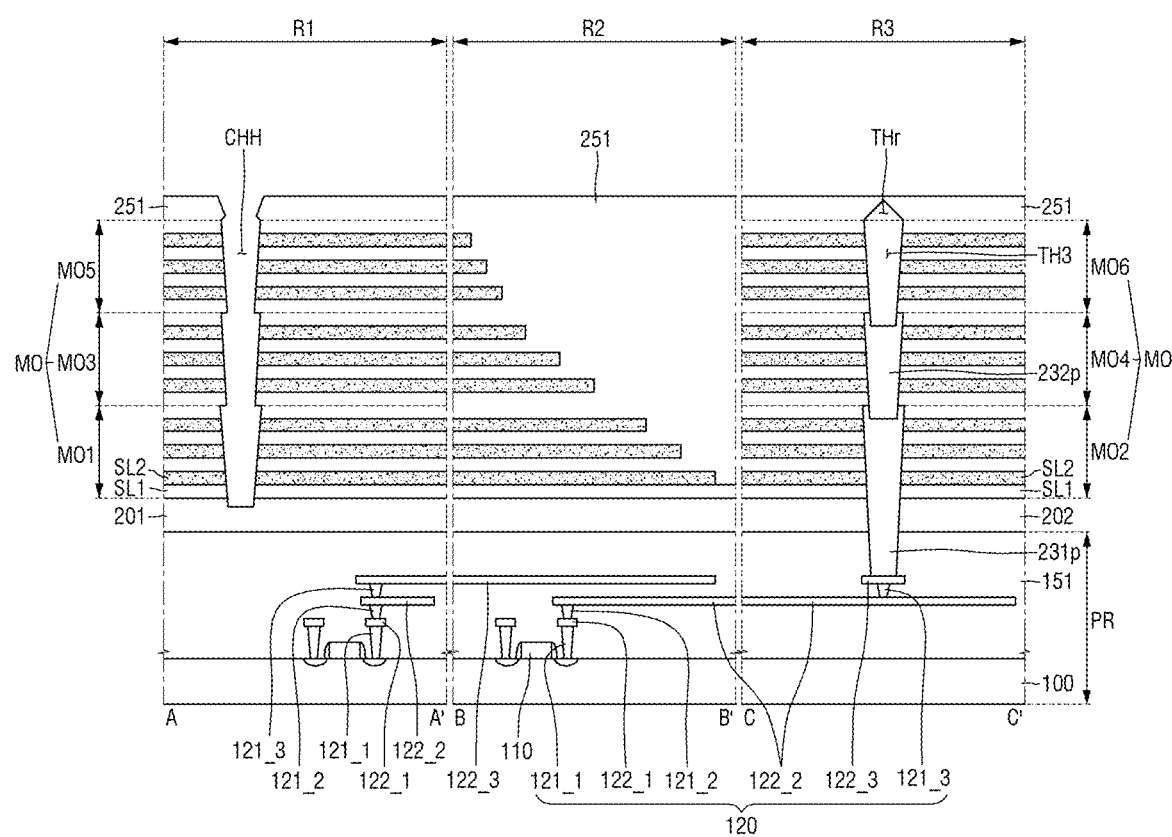

Referring to FIGS. 16a and 16b, the channel hole CHH may be formed in the first region R1. The channel hole CHH may be formed, by removing a part of the second interlayer insulating layer 251 on the channel hole recess CHHr, and by removing the first pre channel part 211p or the second pre channel part 212p (e.g., the first sacrificial channel material or the second sacrificial channel material). The channel hole CHH may penetrate the second interlayer insulating layer 251 and the mold layer MO of the first region R1 to expose the second substrate 201. The channel hole CHH may extend perpendicularly to the second substrate 201.

The method for fabricating the non-volatile memory device according to some embodiments of the technical idea of the present inventive concepts may form the channel hole CHH, by further forming at least one channel hole on the first channel hole CHH1 after forming the first channel hole CHH1 in the non-volatile memory device having a higher aspect ratio. In some embodiments, it is possible to solve the problem that the channel hole CHH does not expose the second substrate 201 due to the higher aspect ratio.

Further, the channel hole CHH according to the method for fabricating the non-volatile memory device of the present inventive concepts may include a portion in which the width of the channel hole CHH varies, by further forming at least one channel hole on the first channel hole CHH1 to form the channel hole CHH after forming the first channel hole CHH1. For example, the width of the upper surface of the first pre channel part 211p may be greater than the width of the bottom surface of the second channel hole CHH2.

Figure 17A:
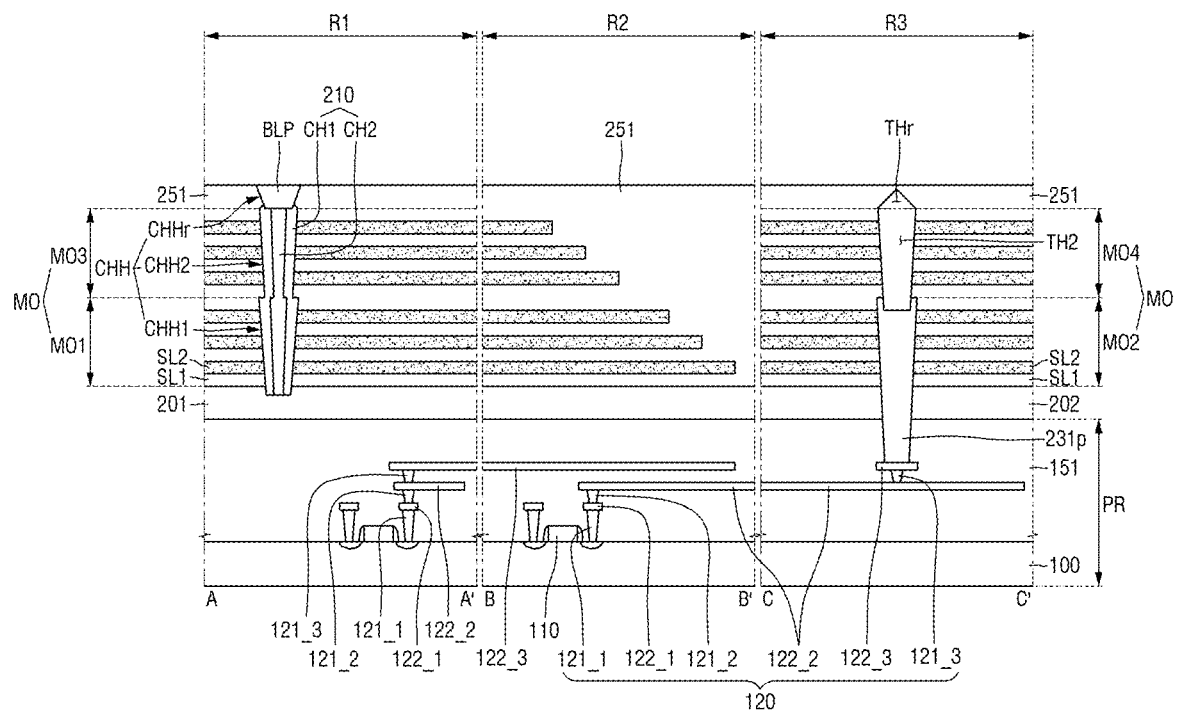

Referring to FIG. 17a, the channel 210 and the bit line pad (BLP) may be formed in the first region R1. The channel 210 may be formed by forming a first channel level CH1 and a second channel level CH2 in the first channel hole CHH1 and the second channel hole CHH2. For example, the first channel level CH1 may be formed on the side walls of the first channel hole CHH1 and the second channel hole CHH2. The first channel level CH1 may not completely fill the first channel hole CHH1 and the second channel hole CHH2. The second channel level CH2 may be formed to fill the portions of the first channel hole CHH1 and the second channel hole CHH2 that are left after the first channel level CH1 is formed.

Figure 17B:
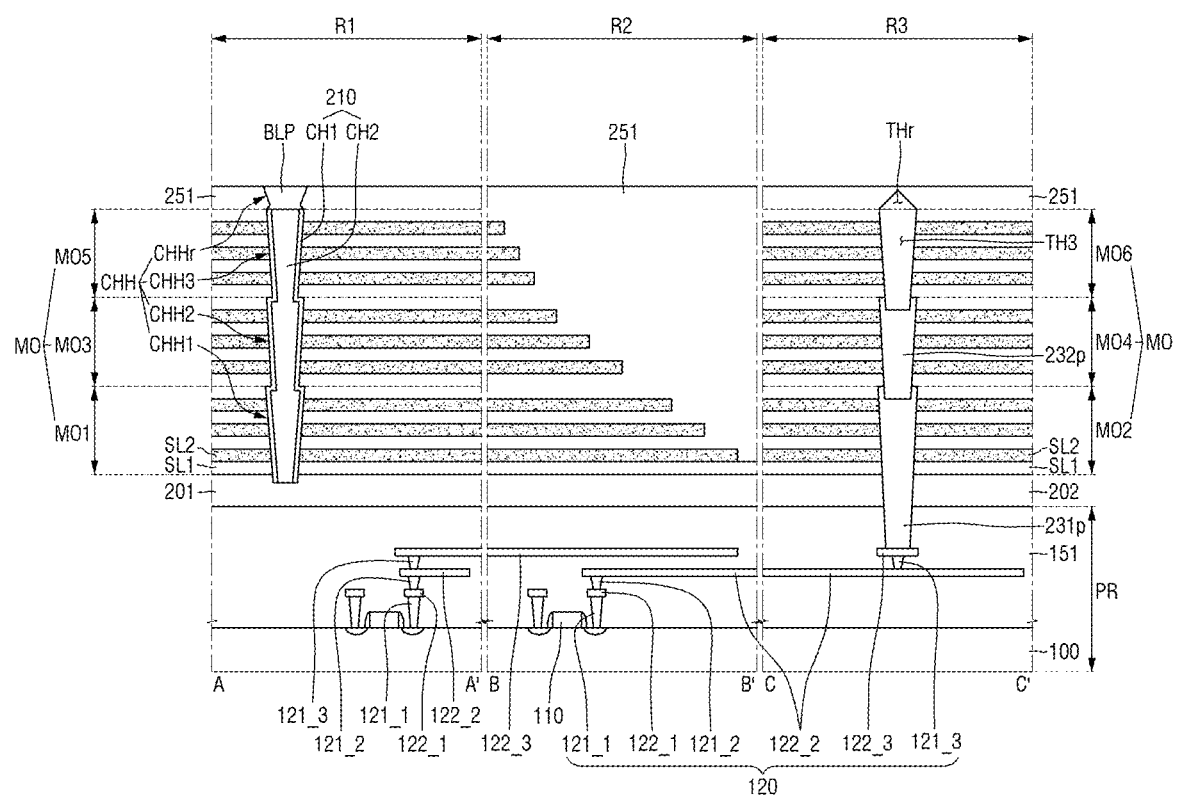

Referring to FIG. 17b, the channel 210 may be formed by forming the first channel level CH1, the second channel level CH2 and the third channel level CH3 in the first channel hole CHH1, the second channel hole CHH2 and the third channel hole CHH3, respectively.

Referring to FIGS. 17a and 17b, the bit line pad (BLP) may be formed to fill the channel hole recess CHHr and the portion in which the second interlayer insulating layer 251 on the channel hole recess CHHr is removed. The bit line pad (BLP) may be formed on the channel 210.

Figure 18A:
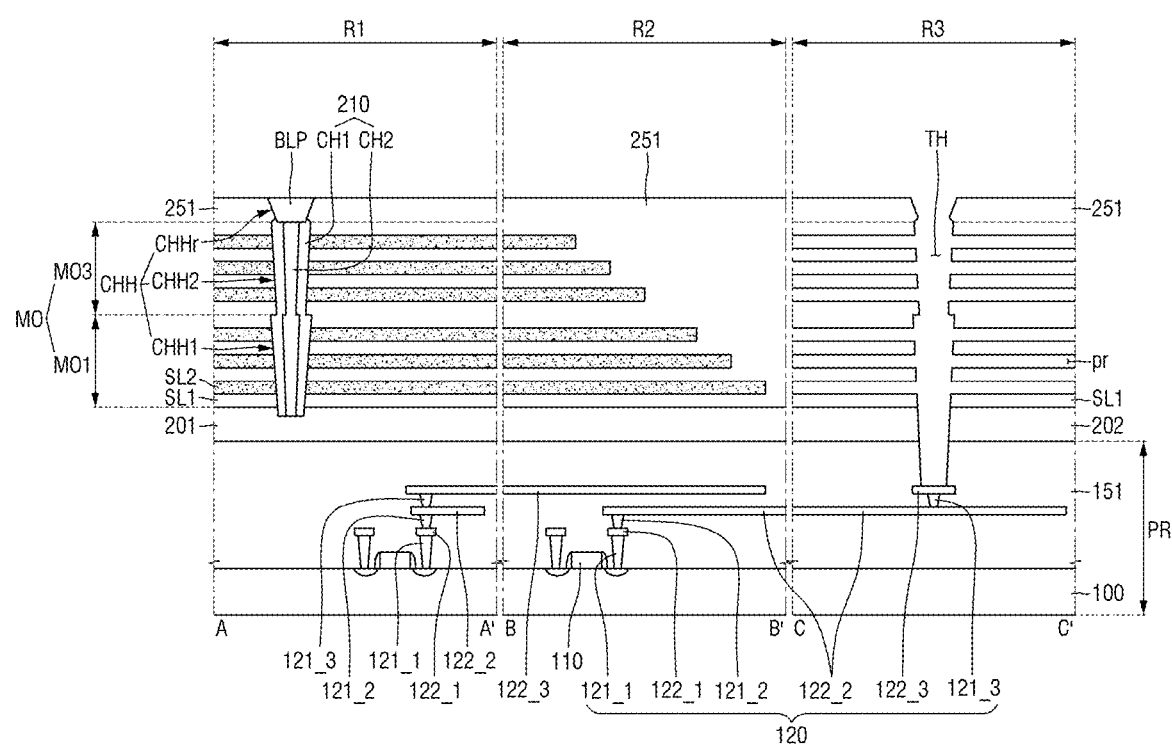
Figure 18B:
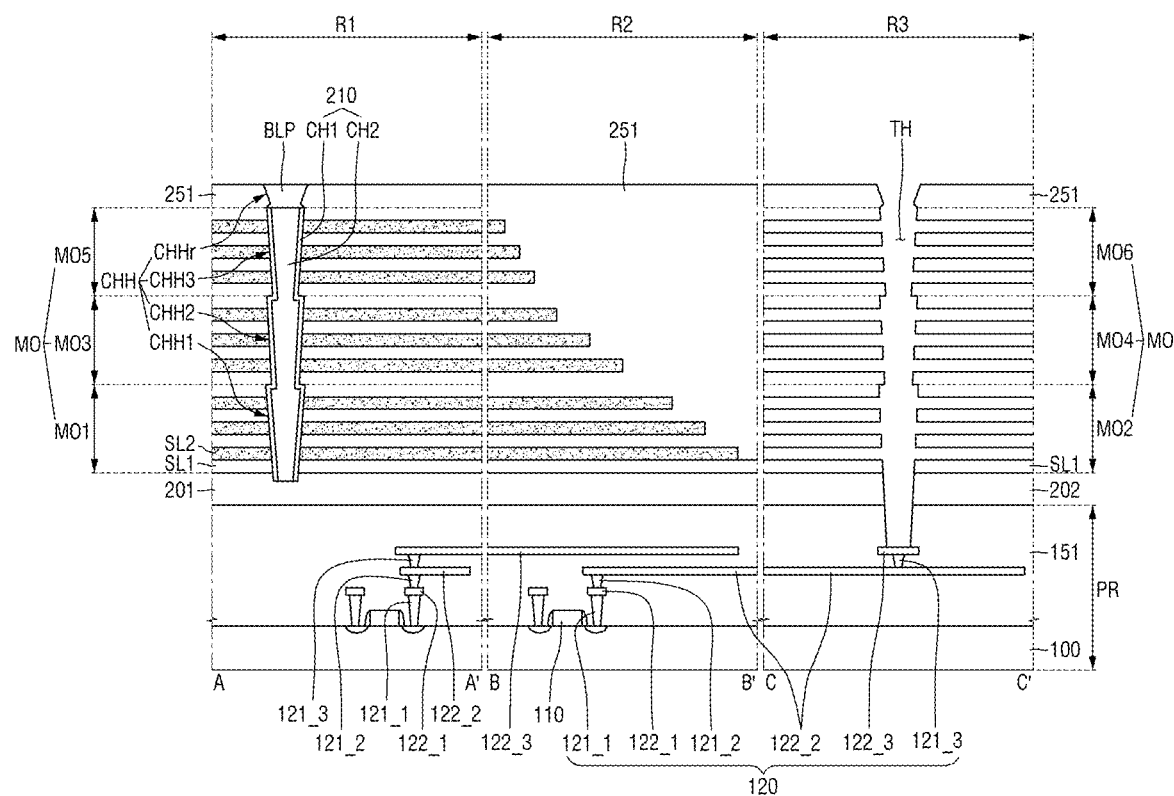

Referring to FIGS. 18a and 18b, the contact hole TH and a first recess region (pr) may be formed in the third region R3. The contact hole TH may be formed, by removing a part of the second interlayer insulating layer 251 on the contact hole recess THr, and by removing the first pre contact part 231p or the second pre contact part 232p (e.g., the first sacrificial contact material or the second sacrificial contact material). The contact hole TH may penetrate the second interlayer insulating layer 251, the mold layer MO of the third region R3, the base layer 202 and the first interlayer insulating layer 151 to expose the lower connection wiring 120. The contact hole TH may extend perpendicularly to the second substrate 201.

The method for fabricating the non-volatile memory device according to some embodiments of the technical idea of the present inventive concepts may form the contact hole TH, by further forming at least one contact hole on the first contact hole TH1 after forming the first contact hole TH1 in the non-volatile memory device having a higher aspect ratio. In some embodiments, it is possible to solve the problem that the contact hole TH does not expose the lower connection wiring 120 due to the higher aspect ratio.

Further, the contact hole TH according to the method for fabricating the non-volatile memory device of the technical idea of the present inventive concepts may include a portion in which the width of the contact hole TH varies, by further forming at least one contact hole on the first contact hole TH1 to form the contact hole TH, after forming the first contact hole TH1. For example, the width of the upper surface of the first pre contact part 231p may be greater than the width of the bottom surface of the second contact hole TH2.

The first recess region (pr) may be formed by removing the second sacrificial layer SL2 exposed by the contact hole TH. The second sacrificial layer SL2 may be selectively removed together with the first sacrificial layer SL1.

Figure 19A:
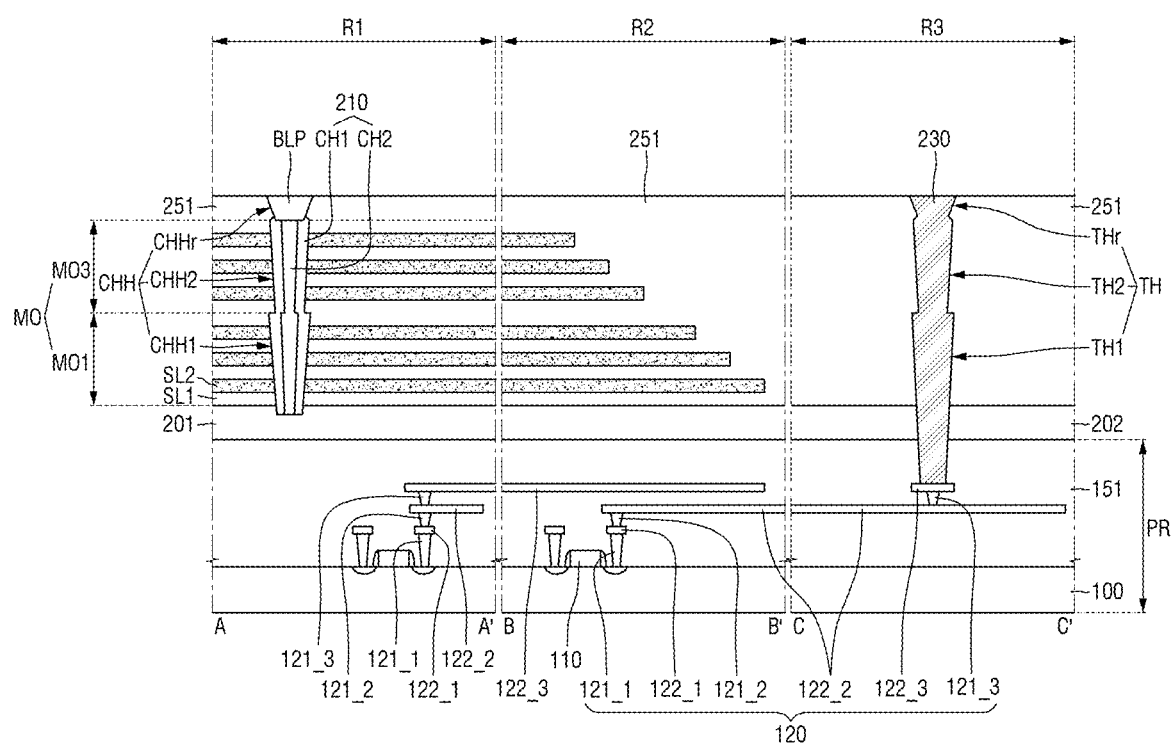

Referring to FIG. 19a, a contact 230 may be formed in the third region R3. The contact 230 may be formed by filling the first contact hole TH1, the second contact hole TH2, the contact hole recess THr, and a portion in which the second interlayer insulating layer 251 on and the contact hole recess THr is removed, with a contact material. The contact material may be, for example, a conductive material. The contact material may be, for example, a metallic material.

Figure 19B:
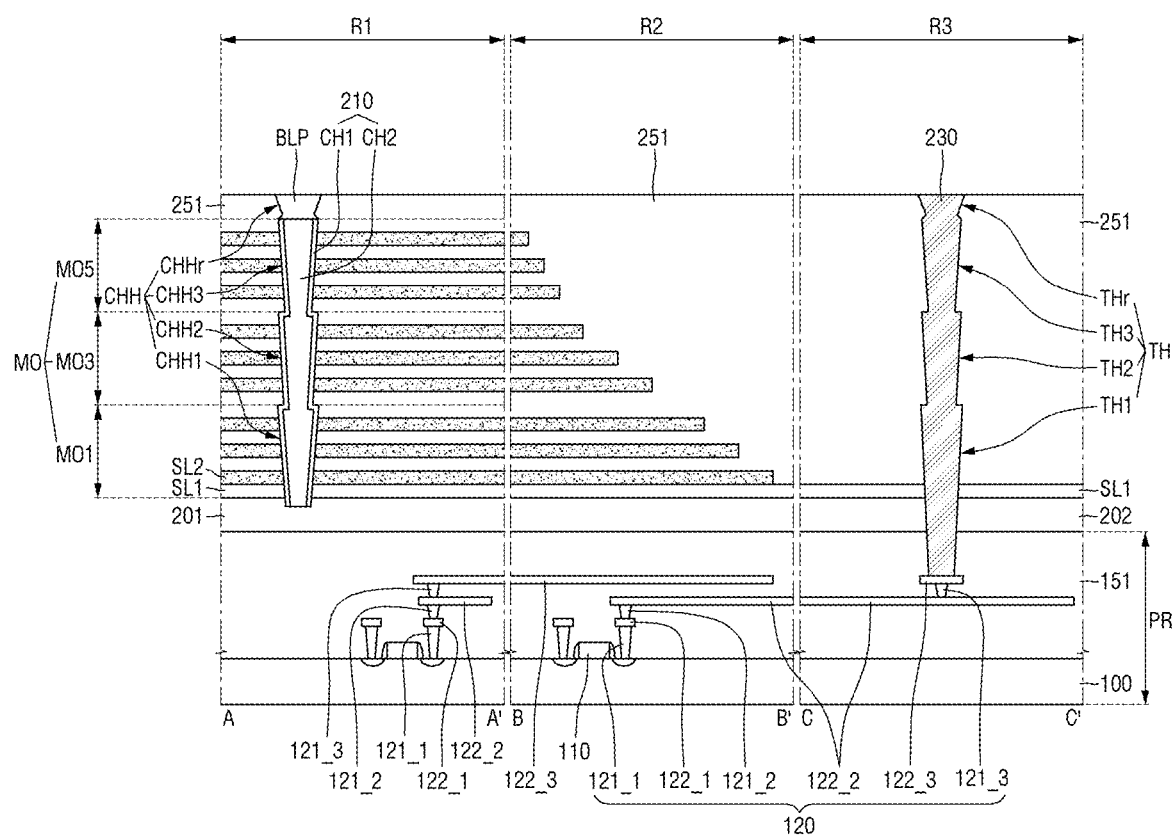

Referring to FIG. 19b, the contact 230 may be formed by filling the first contact hole TH1, the second contact hole TH2, the third contact hole TH3, the contact hole recess THr and/or a portion in which the second interlayer insulating layer 251 on the contact hole recess THr is removed, with a contact material.

Referring to FIGS. 19a and 19b, the first recess region (pr) may be filled with, for example, the material contained in the second interlayer insulating layer 251.

Figure 20A:
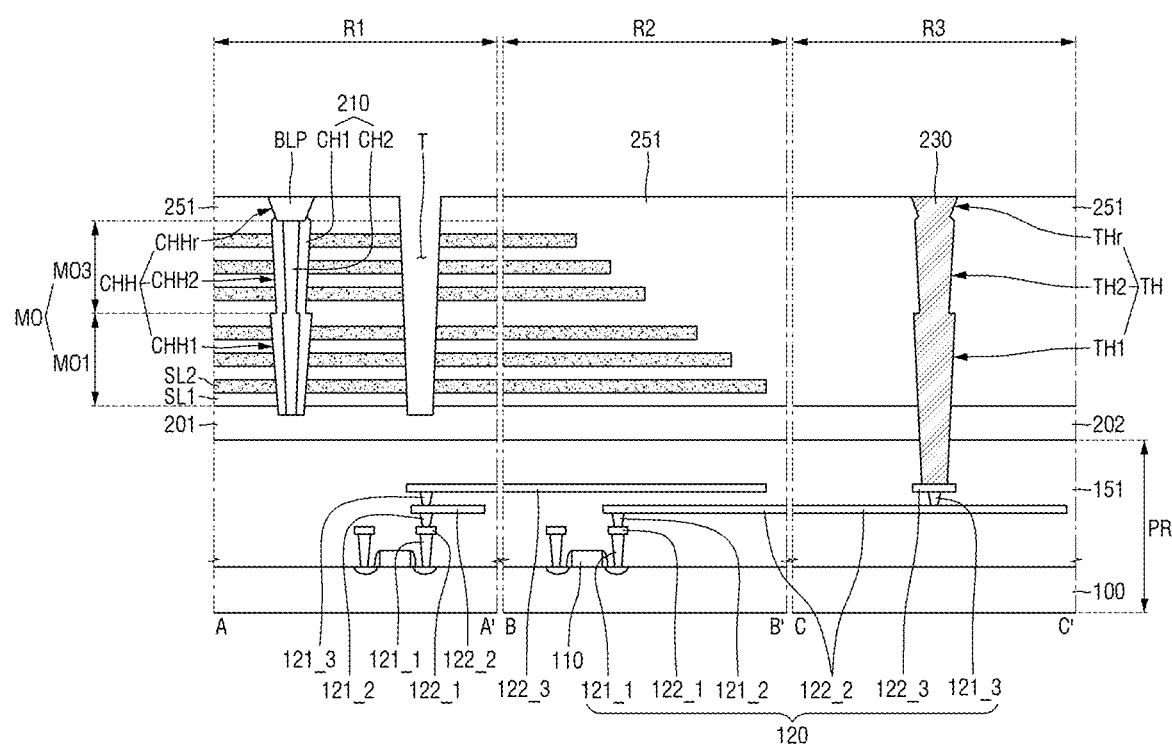
Figure 20B:
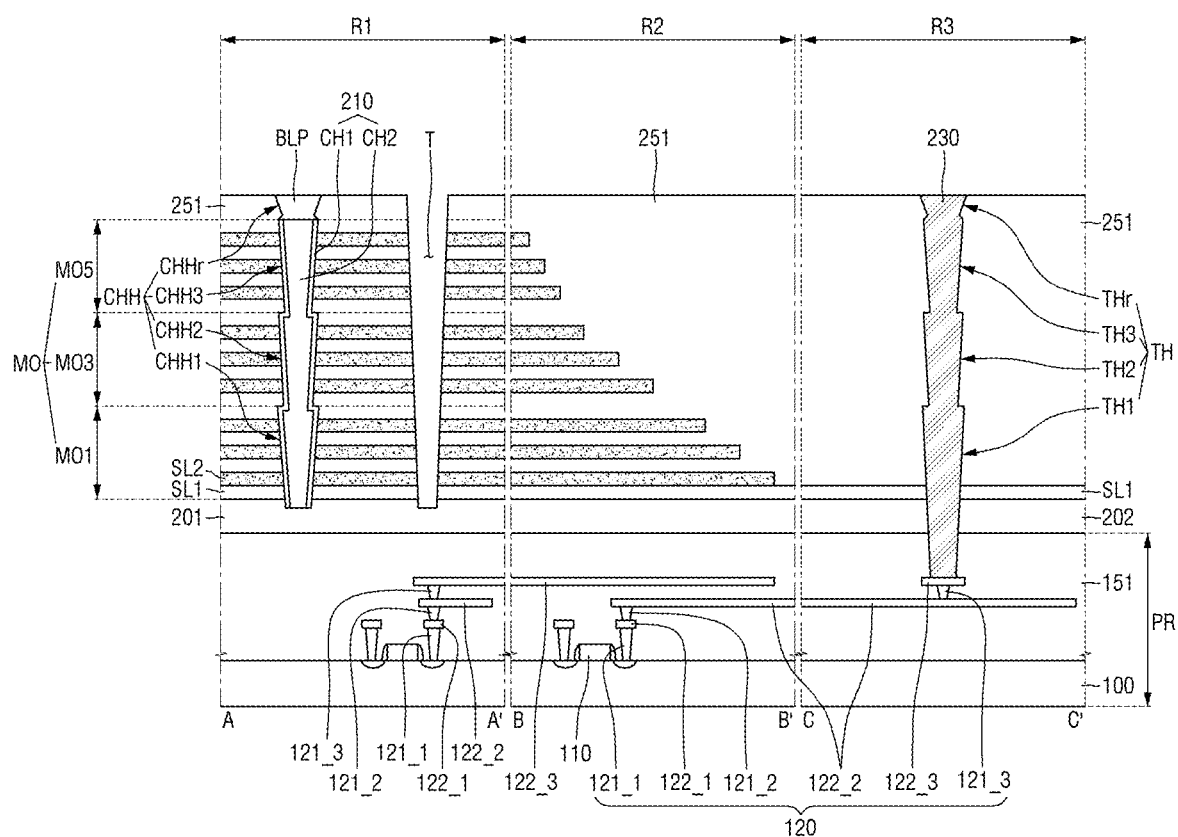

Referring to FIGS. 20a and 20b, a trench (T) may be formed in the second interlayer insulating layer 251 of the first region R1 and the mold layer MO. The trench (T) may be formed in the first region R1 to be spaced apart from the channel 210. The trench (T) may penetrate the mold layer MO of the first region R1 to expose the second substrate 201. The trench (T) may extend, for example, to a part of the second substrate 201. In other words, a part of the trench (T) may be formed in the second substrate 201.

Figure 21A:
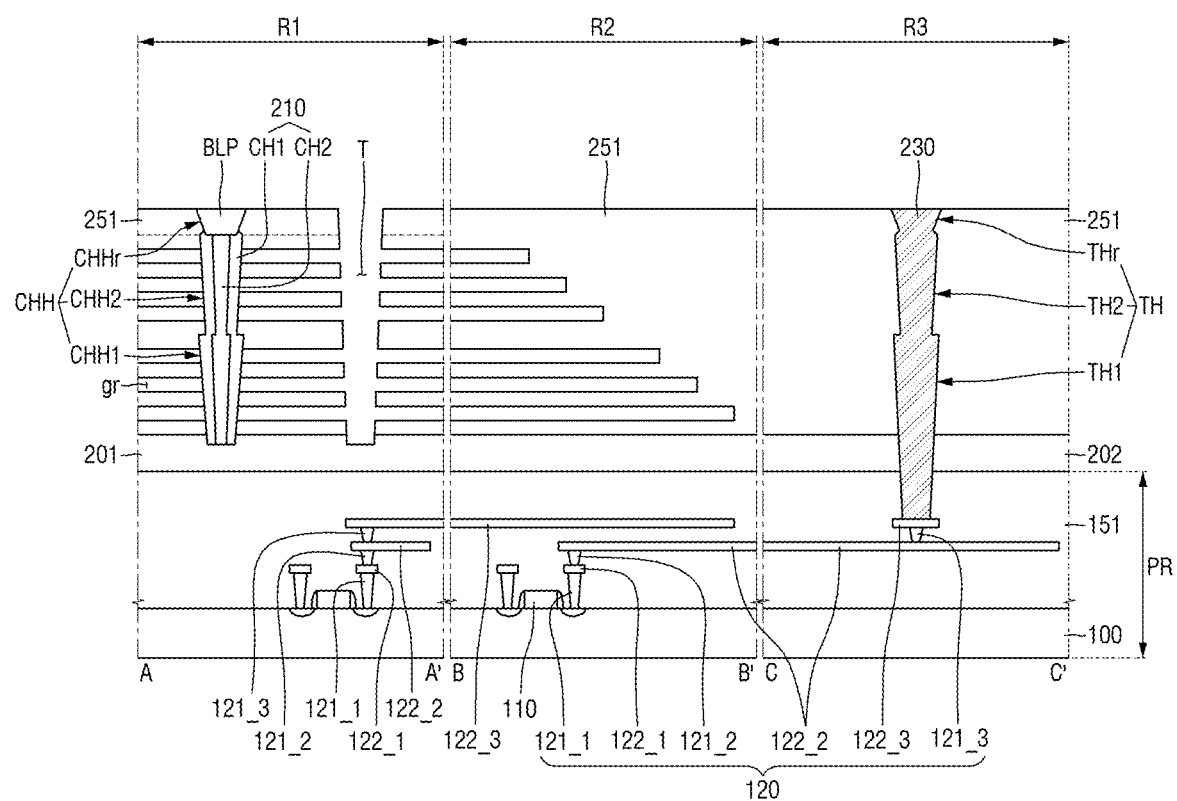
Figure 21B:
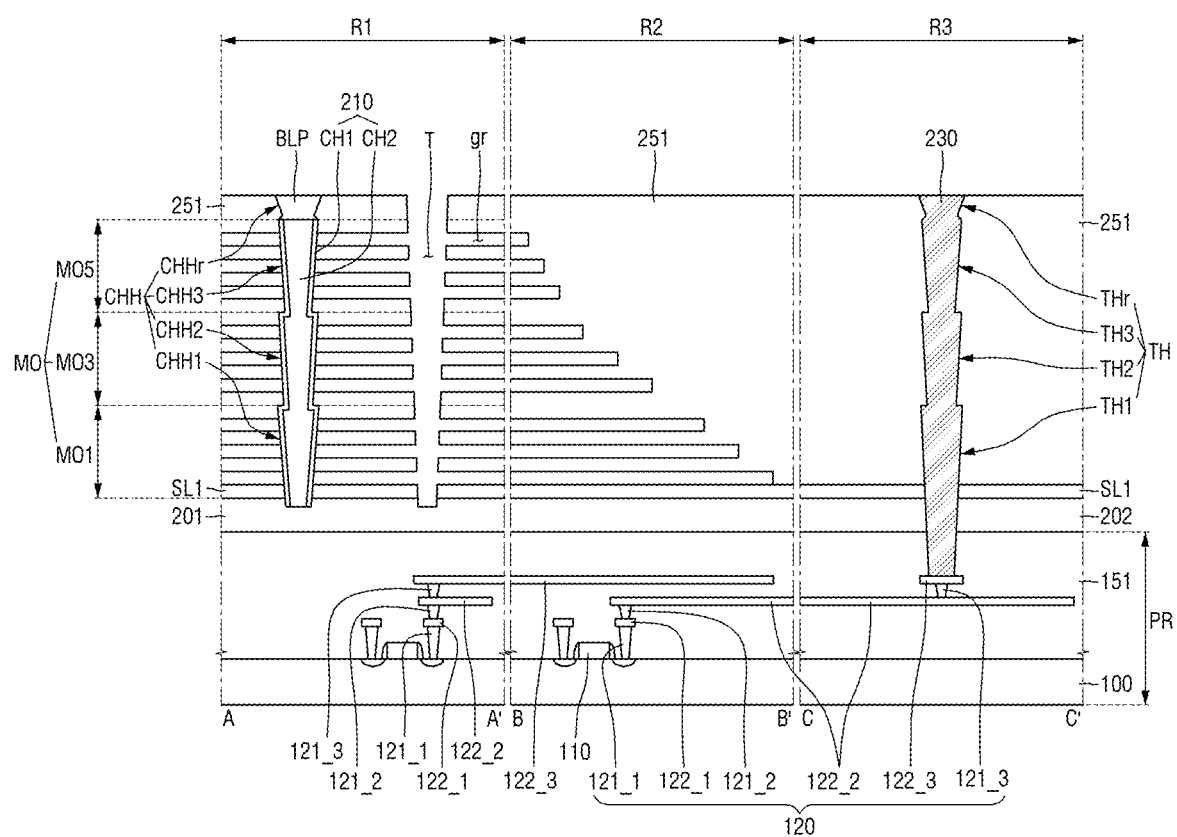

Referring to FIGS. 21a and 21b, a second recess region (gr) may be formed. The first sacrificial layer SL1 and the second sacrificial layer SL2 may be exposed by the trench (T). The second recess region (gr) may be formed by removing the second sacrificial layer SL2 exposed by the trench (T). For example, the second sacrificial layer SL2 exposed by the trench (T) is removed to form the second recess region (gr) between the channel 210 and the trench (T). Further, the second sacrificial layer SL2 of the second region R2 may also be removed.

Figure 22A:
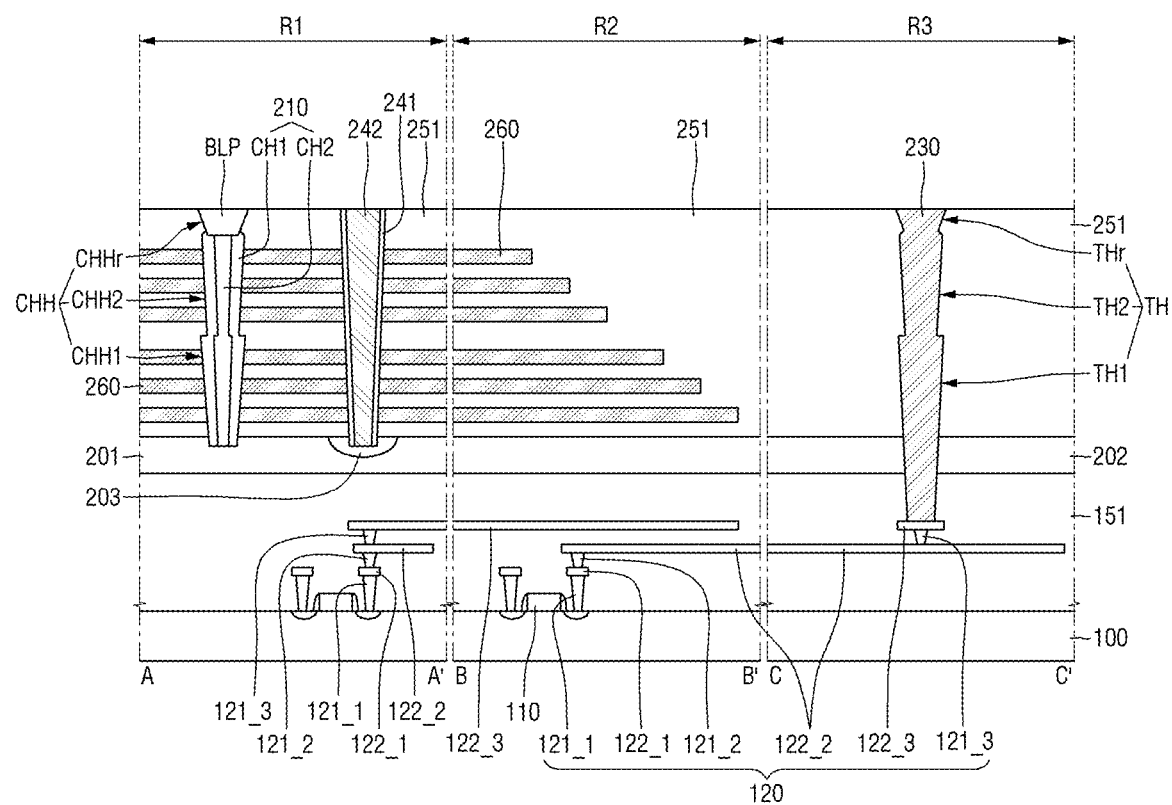
Figure 22B:
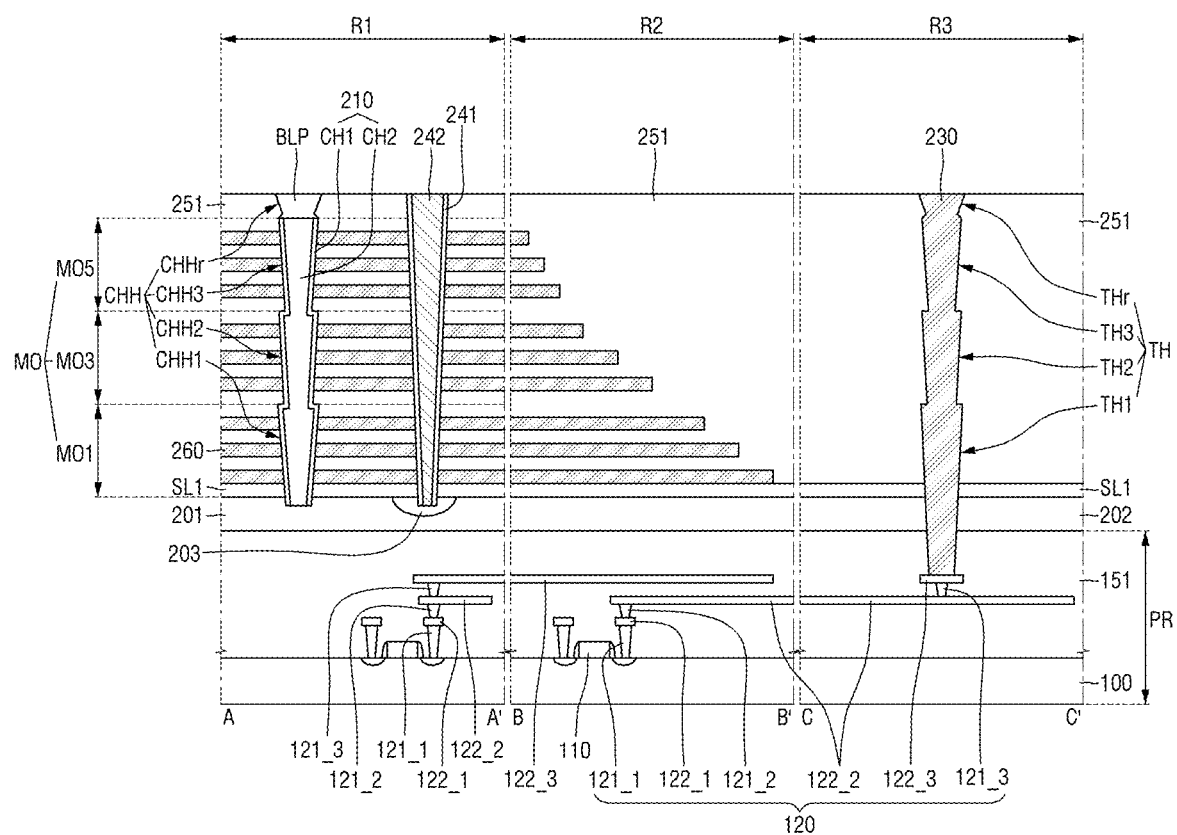

Referring to FIGS. 22a and 22b, a gate electrode 260, an impurity region 203, a conductive line 242 and/or an insulating layer 241 of a conductive line may be formed. The gate electrode 260 may be formed in the second recess region (gr). The gate electrode 260 may be formed in the first region R1 and the second region R2. The impurity region 203 may be formed in the second substrate 201 exposed by the trench (T). The insulating layer 241 of the conductive line may be formed along the side wall of the trench (T). The insulating layer 241 of the conductive line may not entirely fill the trench (T). The conductive line 242 may be formed to fill a portion of the trench (T) which is left after the insulating layer 241 of the conductive line is formed.

The upper connection wiring (220 of FIG. 3a) may be formed on the second interlayer insulating layer 251.

Hereinafter, the method for fabricating the non-volatile memory device according to some embodiments of the technical idea of the present inventive concepts will be described with reference to FIGS. 11, 12, and 23 to 29. For the sake of clarity of explanation, the repeated part of the aforementioned description will be simplified or omitted.

Figure 23:
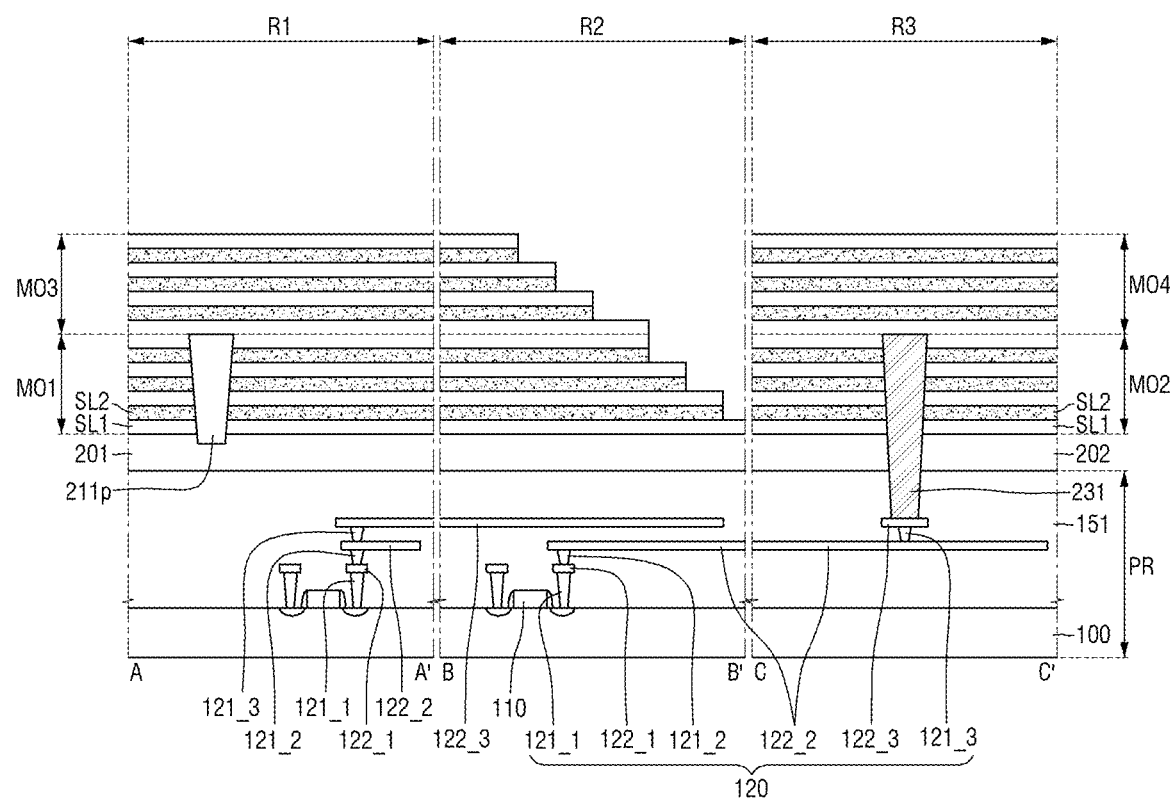
FIGS. 23 to 29 are intermediate stage diagrams for explaining the method for fabricating the non-volatile memory device according to some embodiments of the technical idea of the present inventive concepts.

FIGS. 23 to 29 are intermediate stage diagrams for explaining the method for fabricating the non-volatile memory device according to some embodiments of the technical idea of the present inventive concepts. FIG. 23 may be a drawing after the operations of the method for fabricating the non-volatile memory device described above with reference to FIGS. 11 and 12 are performed.

Referring to FIG. 23, the first contact part 231 may be formed in the first contact hole TH1. For example, the first contact part 231 may be formed by filling the first contact hole TH1 with the first sacrificial contact material. In some embodiments, the first sacrificial contact material may be, for example, a metallic material. Subsequently, a third mold layer MO3 and a fourth mold layer MO4 may be formed.

Figure 24:
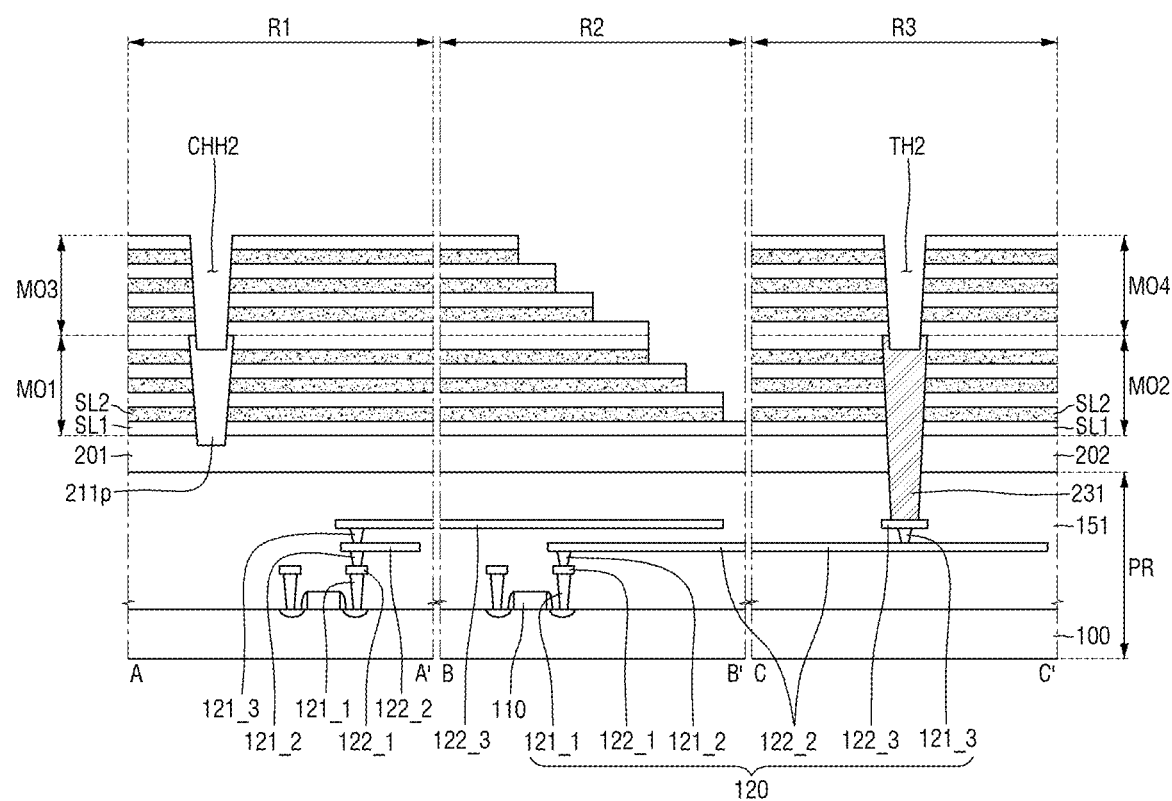

Referring to FIG. 24, the second channel hole CHH2 and the second contact hole TH2 may be formed. The second contact hole TH2 may expose the first contact part 231 through the fourth mold layer MO4 formed in the third region R3. The second contact hole TH2 may extend, for example, to a part of the first contact part 231. In other words, a part of the second contact hole TH2 may be formed in the first contact part 231.

Figure 25:
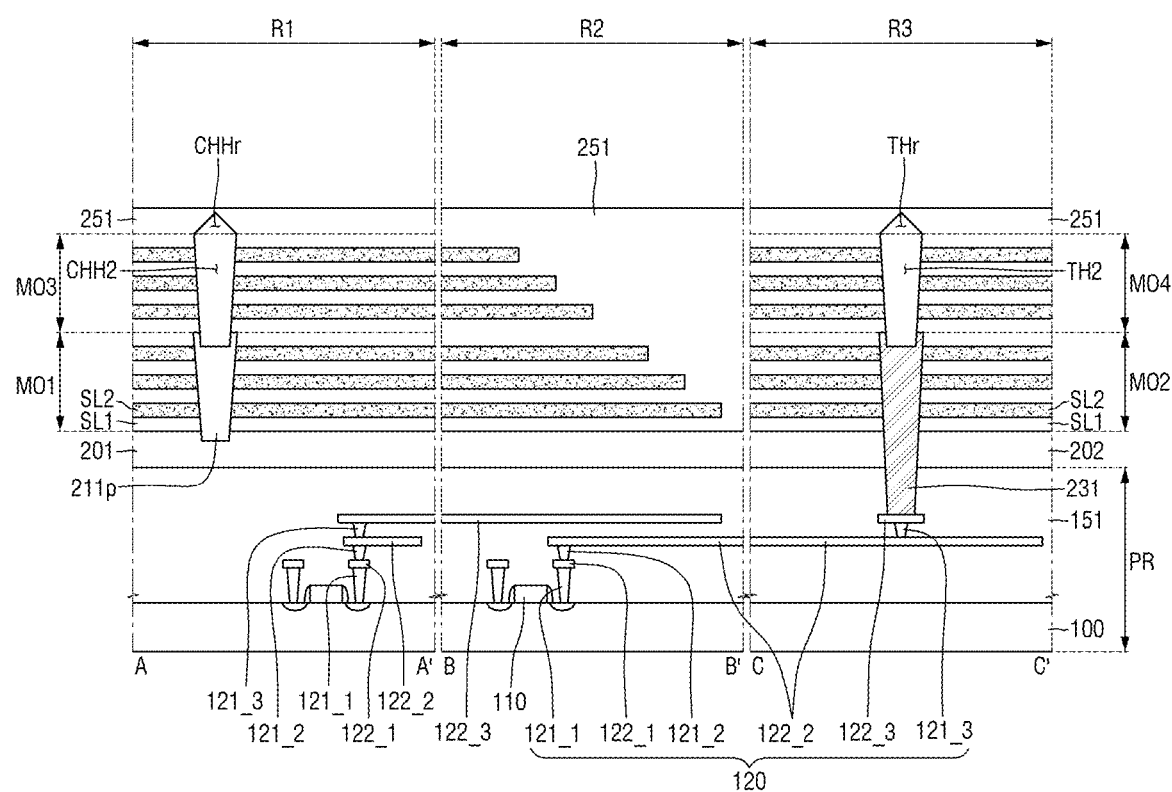

Referring to FIG. 25, the second interlayer insulating layer 251 may be formed.

Figure 26:
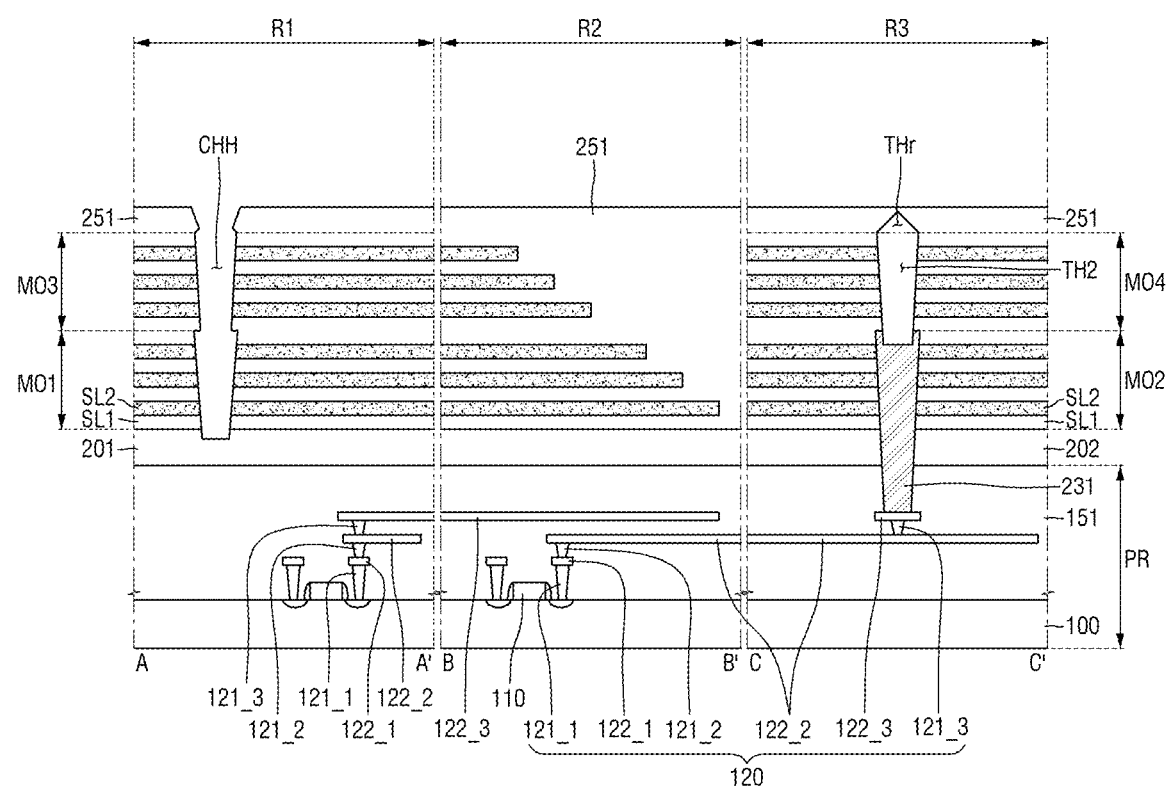

Referring to FIG. 26, the channel hole CHH may be formed in the first region R1.

Figure 27:
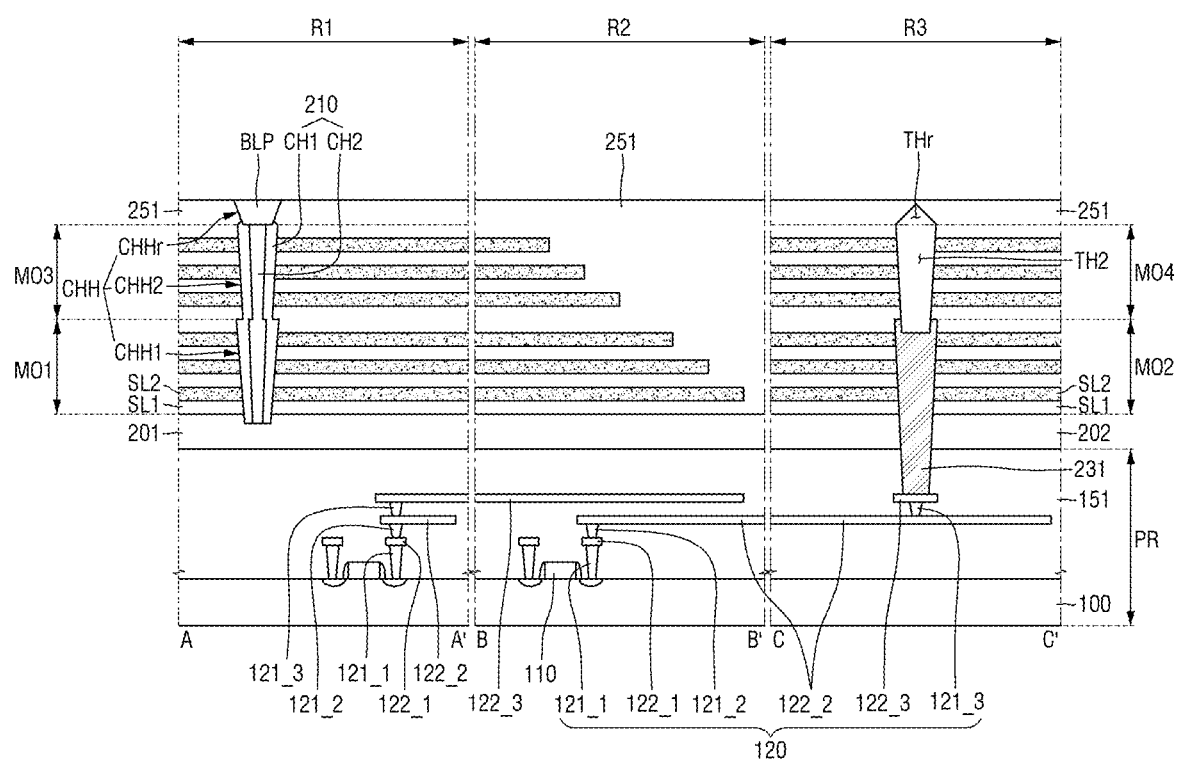

Referring to FIG. 27, the channel 210 and the bit line pad (BLP) may be formed in the first region R1.

Figure 28:
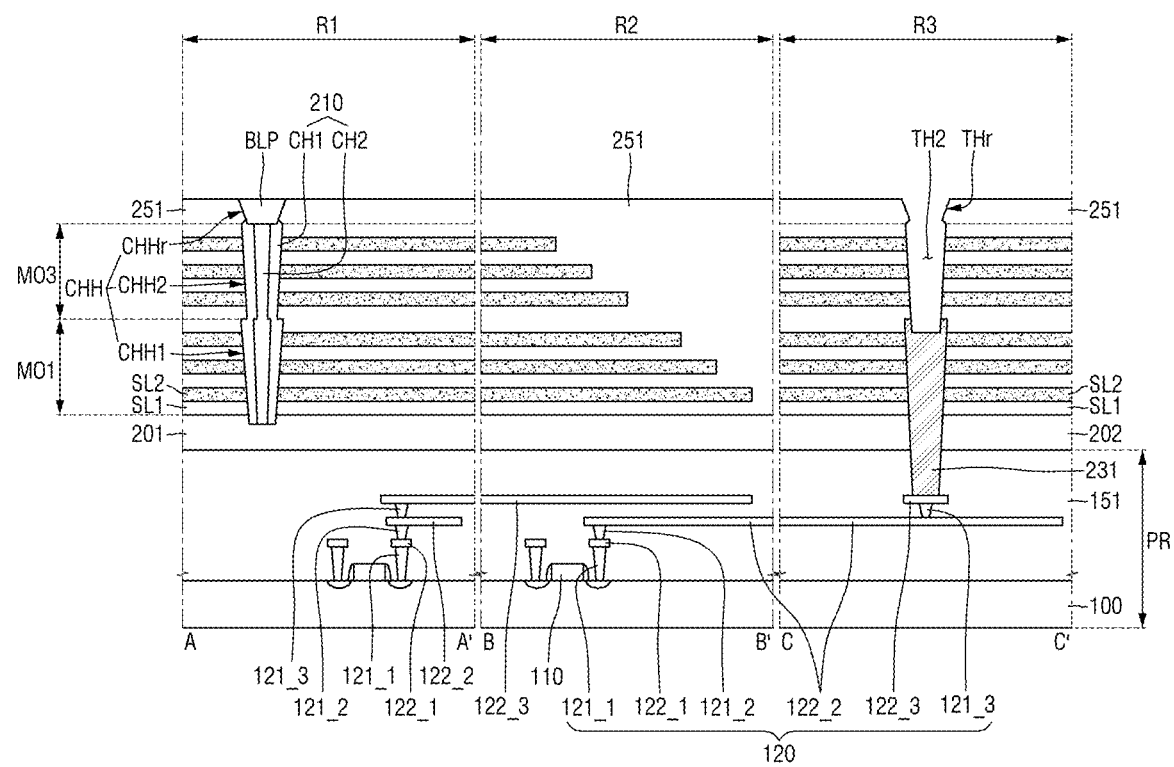

Referring to FIG. 28, a part of the second interlayer insulating layer 251 on the contact hole recess THr may be removed.

Figure 29:
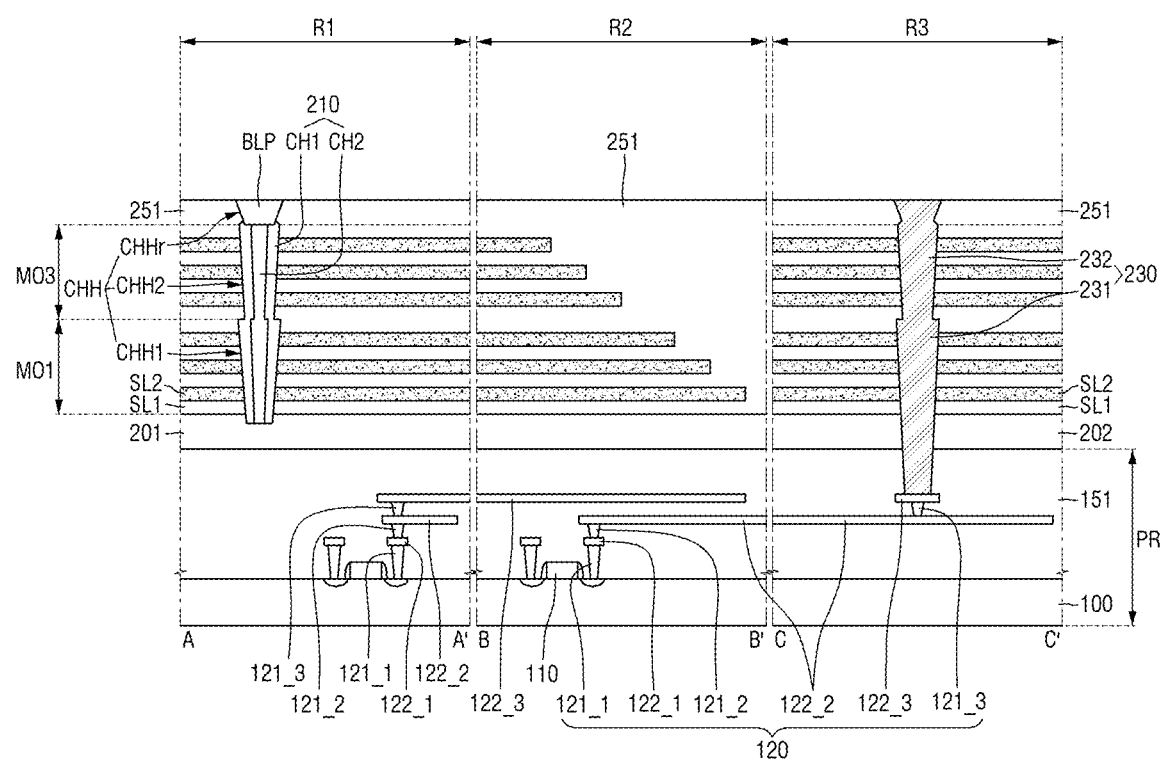

Referring to FIG. 29, the contact 230 may be formed. The contact 230 may be formed by filling the second contact hole TH2, the contact hole recess THr and a portion in which a part of the second interlayer insulating layer 251 on the contact hole recess THr is removed, with a contact material. In some embodiments, the contact material may be the same as the first sacrificial contact material. For example, the contact material and the first sacrificial contact material may be the metallic materials.

As described with reference to FIG. 5, in some embodiments, the first sacrificial layer SL1 and the second sacrificial layer SL2 of the third region R3 may remain unremoved.

Hereinafter, the method for fabricating the non-volatile memory device according to some embodiments of the technical idea of the present inventive concepts will be described with reference to FIGS. 11 and 30 to 37. For the sake of clarity of explanation, the repeated part of the aforementioned description will be simplified or omitted.

Figure 30:
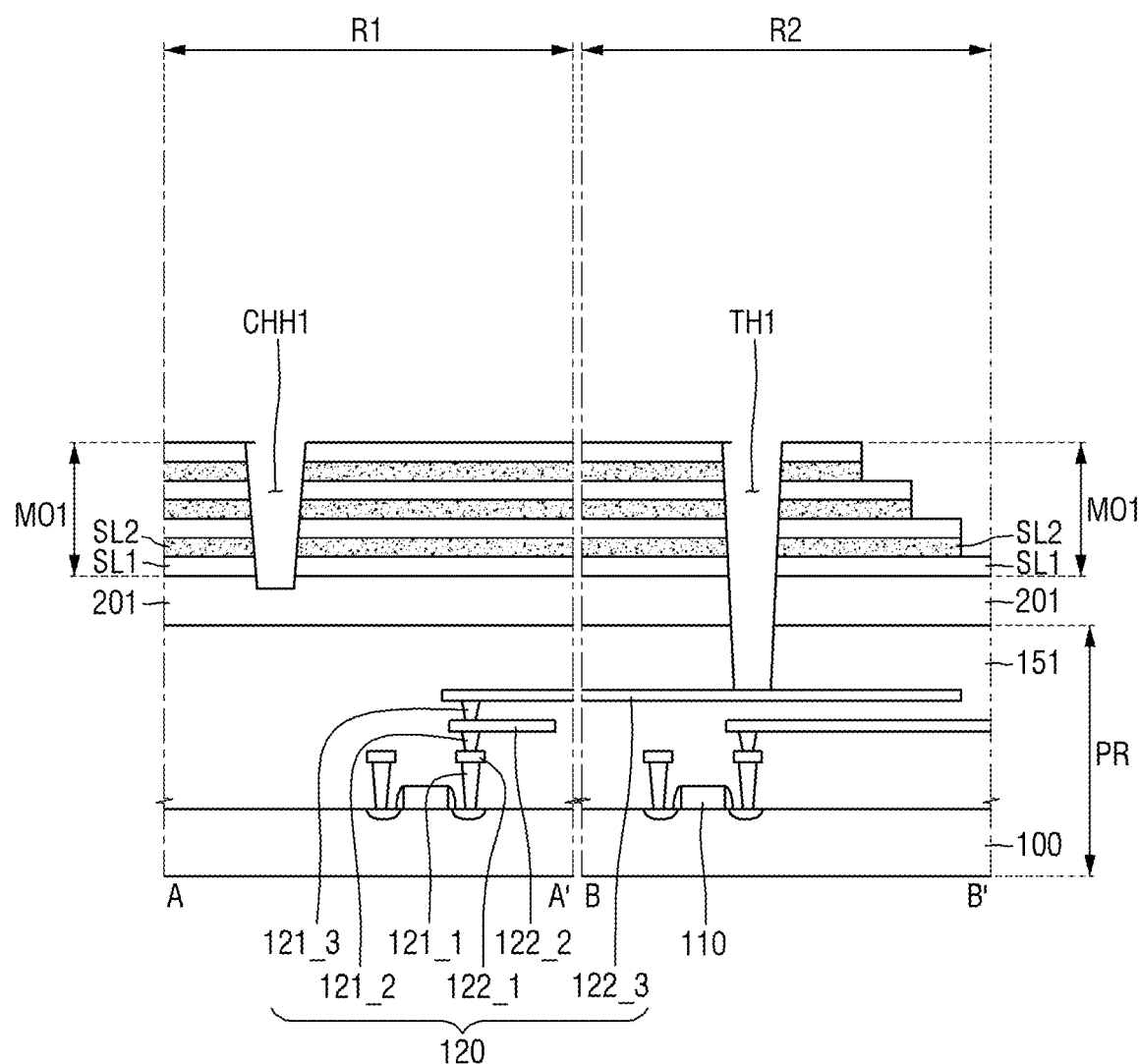
FIGS. 30 to 37 are intermediate stage diagrams for explaining the method for fabricating the non-volatile memory device according to some embodiments of the technical idea of the present inventive concepts.

FIGS. 30 to 37 are intermediate stage diagrams for explaining the method for fabricating the non-volatile memory device according to some embodiments of the technical idea of the present inventive concepts. FIG. 30 may be a drawing after the fabricating process of the non-volatile memory device in the first region R1 and the second region R2 of FIG. 11 is performed.

Referring to FIG. 30, the first channel hole CHH1 may be formed in the first region R1, and the first contact hole TH1 may be formed in the second region R2. The first channel hole CHH1 and the first contact hole TH1 may be formed at the same time. The first contact hole TH1 may penetrate the first mold layer MO1 formed in the second region R2 and the second substrate 201. The first contact hole TH1 may extend to the inside of the peripheral circuit region (PR) to expose the lower connection wiring 120.

Figure 31:
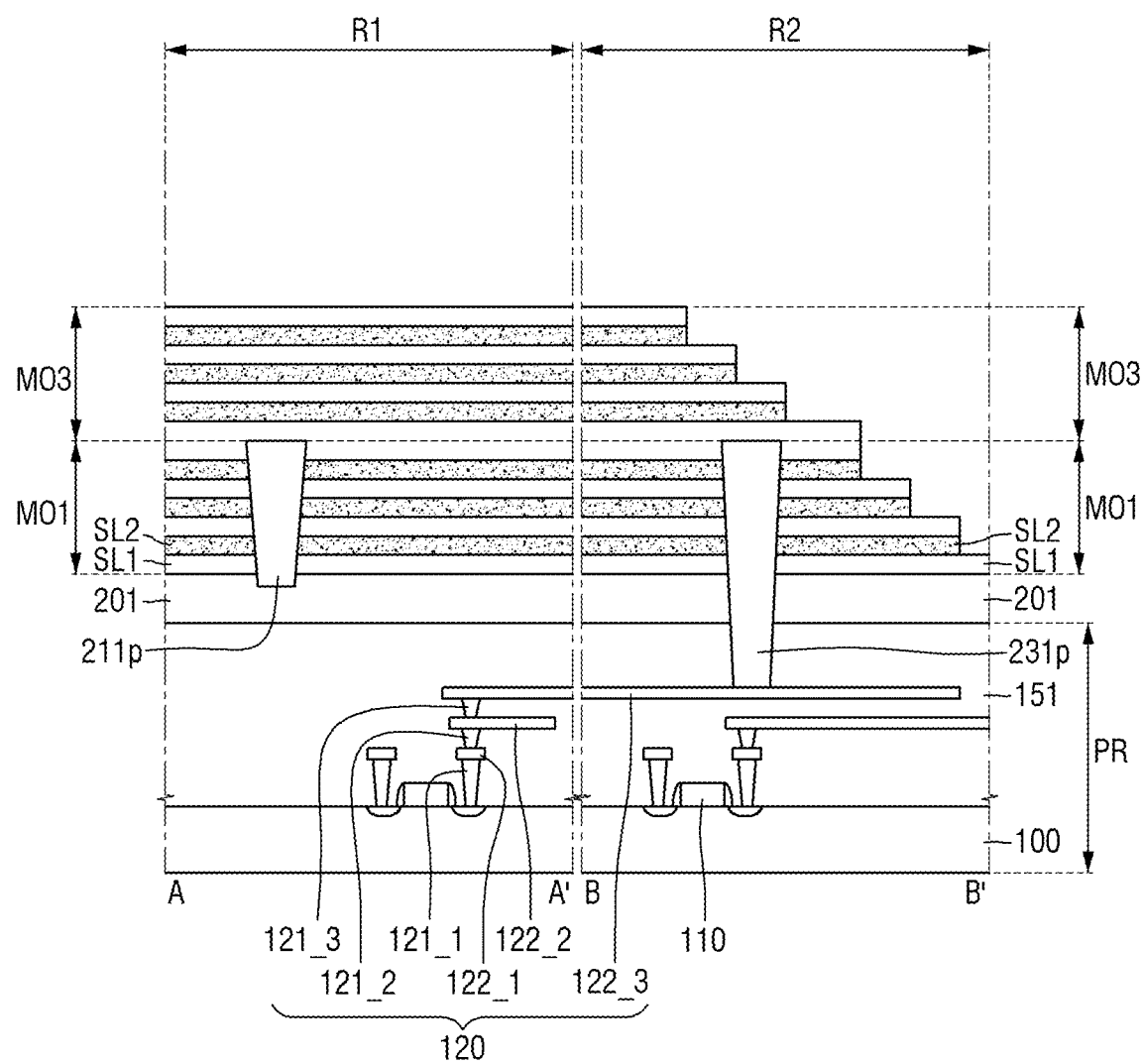

Referring to FIG. 31, a first pre channel part 211p and a first pre contact part 231p may be formed. Further, the third mold layer MO3 may be formed on the first mold layer MO1 of the second region R2. For example, the third mold layer MO3 of the second region R2 may cover the first pre contact part 231p. However, the technical idea of the present inventive concepts is not limited thereto. For example, the third mold layer MO3 of the second region R2 is formed on a part of the first pre contact part 231p, and may expose a part of the first pre contact part 231p.

Figure 32:
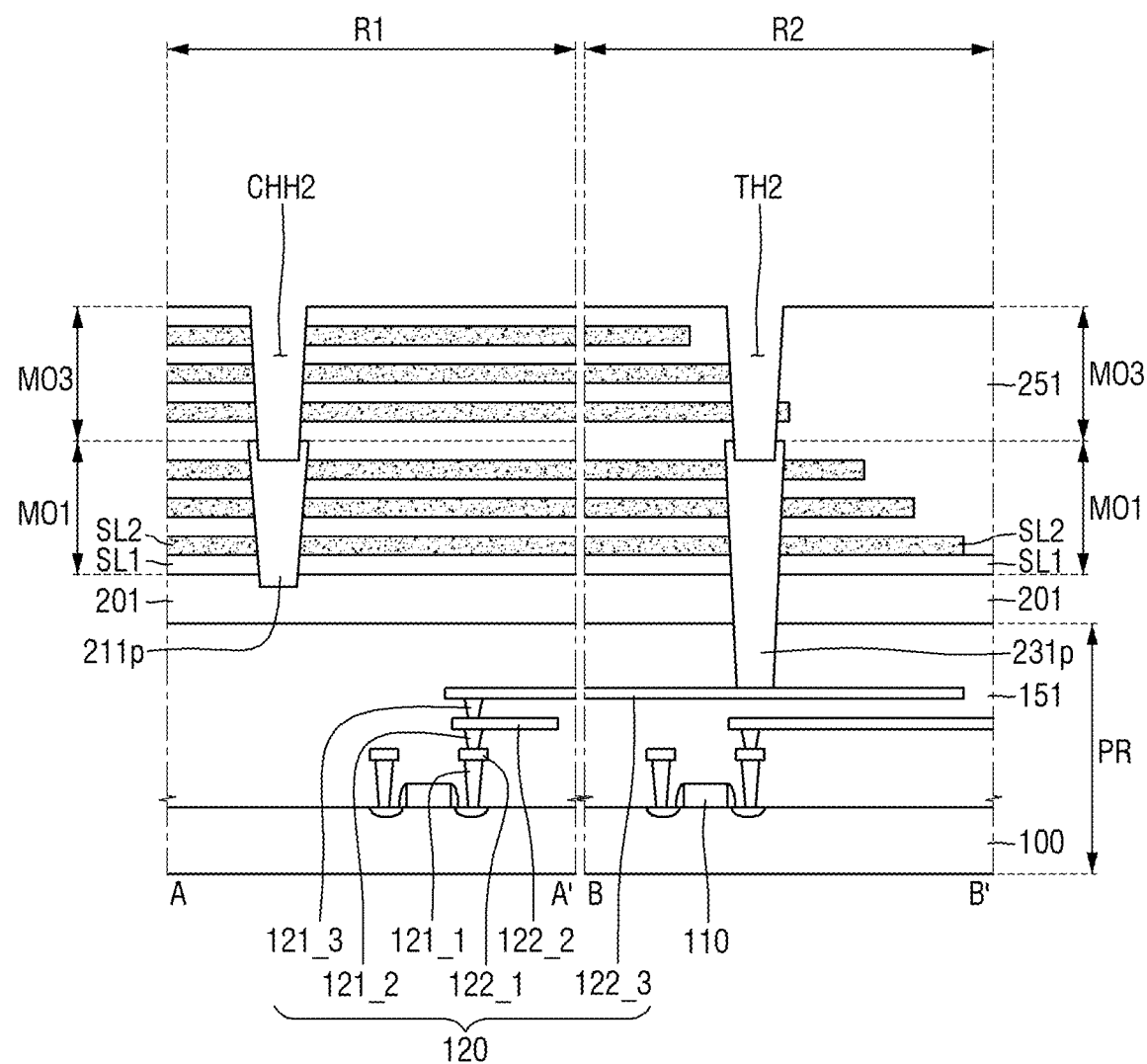

Referring to FIG. 32, a second interlayer insulating layer 251 may be formed on the third mold layer MO3 and the first mold layer MO1 of the second region R2. The second interlayer insulating layer 251 may expose the first sacrificial layer SL1 on the uppermost level of the third mold layer MO3 of the first region R1 and the second region R2. The second contact hole TH2 may be formed in the third mold layer MO3 formed in the second region R2 and the second interlayer insulating layer 251. The second contact hole TH2 may penetrate the second interlayer insulating layer 251 and the third mold layer MO3 formed in the second region R2 to expose the first pre contact part 231p.

Figure 33:
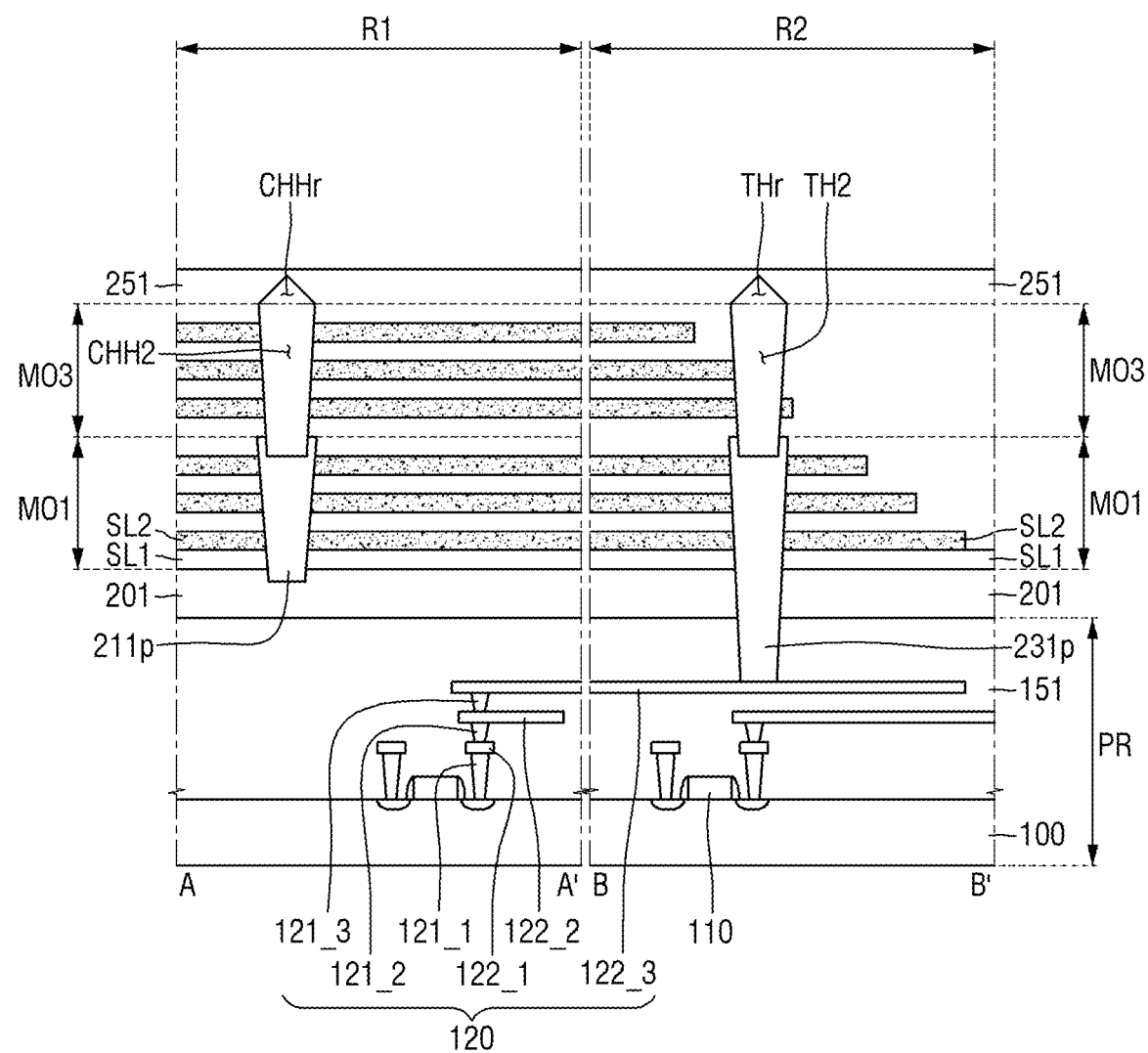

Referring to FIG. 33, the second interlayer insulating layer 251 may be further formed. The second interlayer insulating layer 251 may be further formed on the second channel hole CHH2, the third mold layer MO3 of the first region R1, the second contact hole TH2, and the second interlayer insulating layer 251 formed in advance. At this time, the contact hole recess THr may be formed on the second contact hole TH2. Further, the channel hole recess CHHr may be formed on the second channel hole CHH2.

Figure 34:
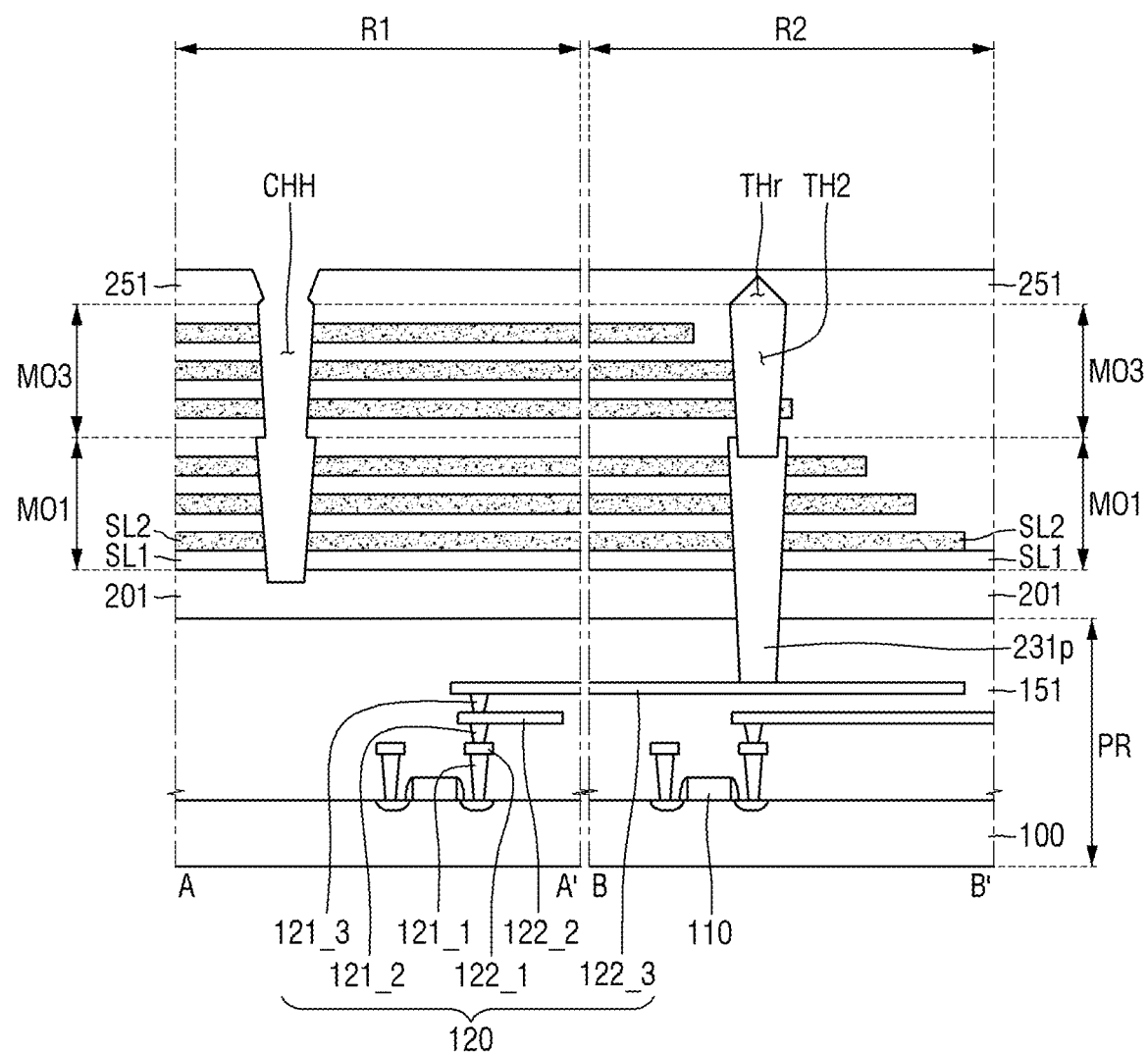

Referring to FIG. 34, the channel hole CHH may be formed in the first region R1.

Figure 35:
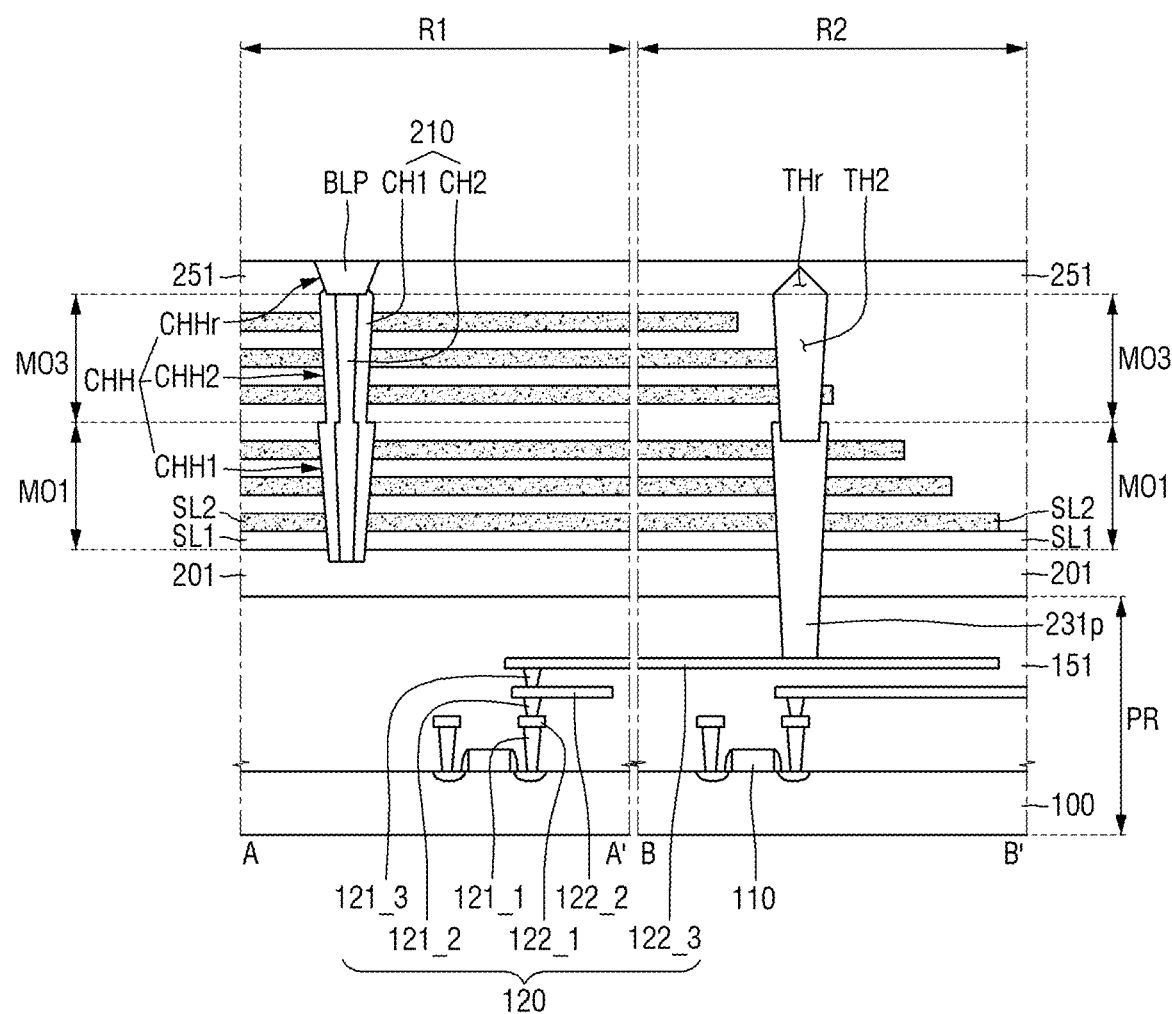

Referring to FIG. 35, the channel 210 may be formed in the first region R1.

Figure 36:
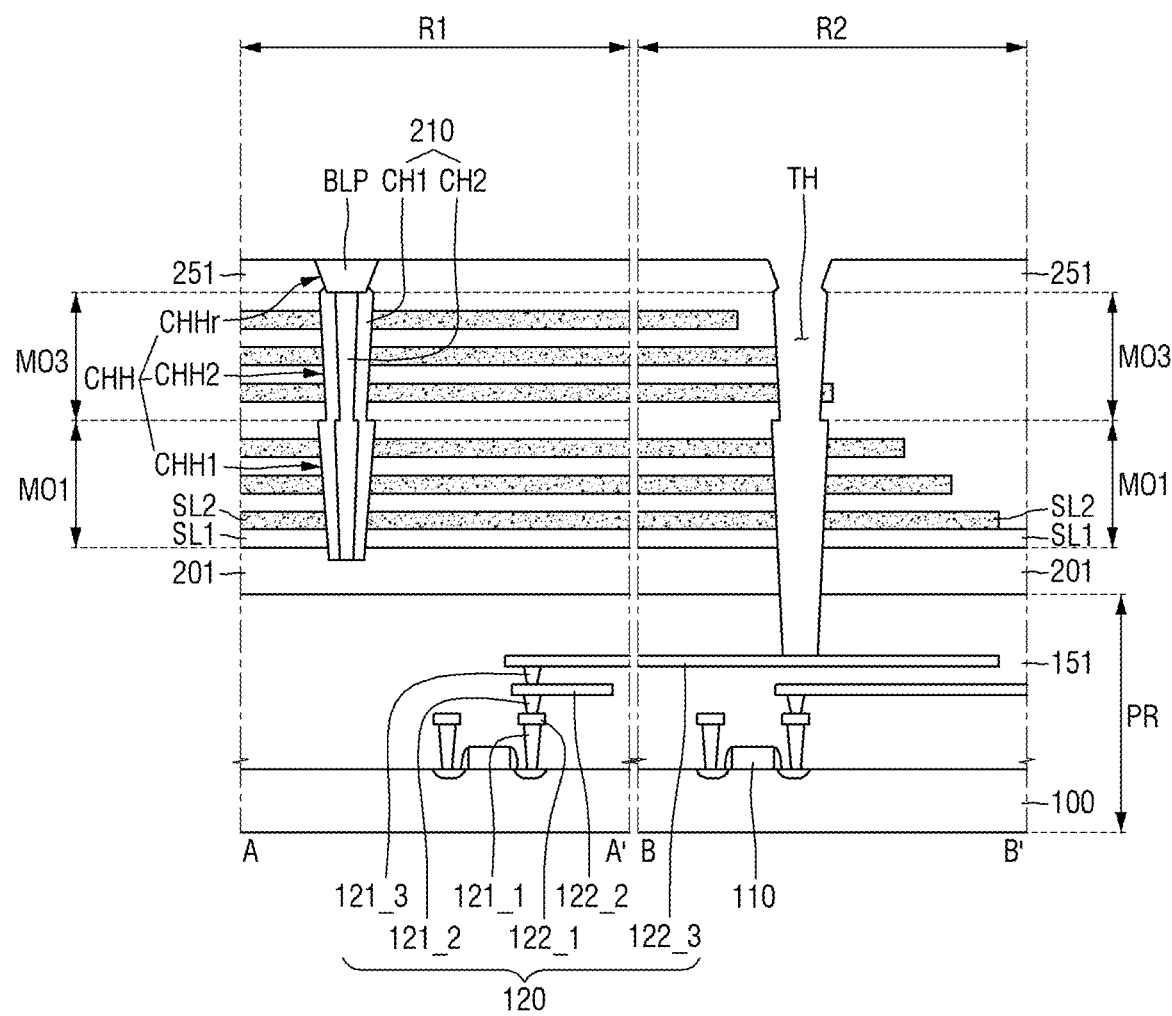

Referring to FIG. 36, the contact hole TH can be formed in the second region R2.

Figure 37:
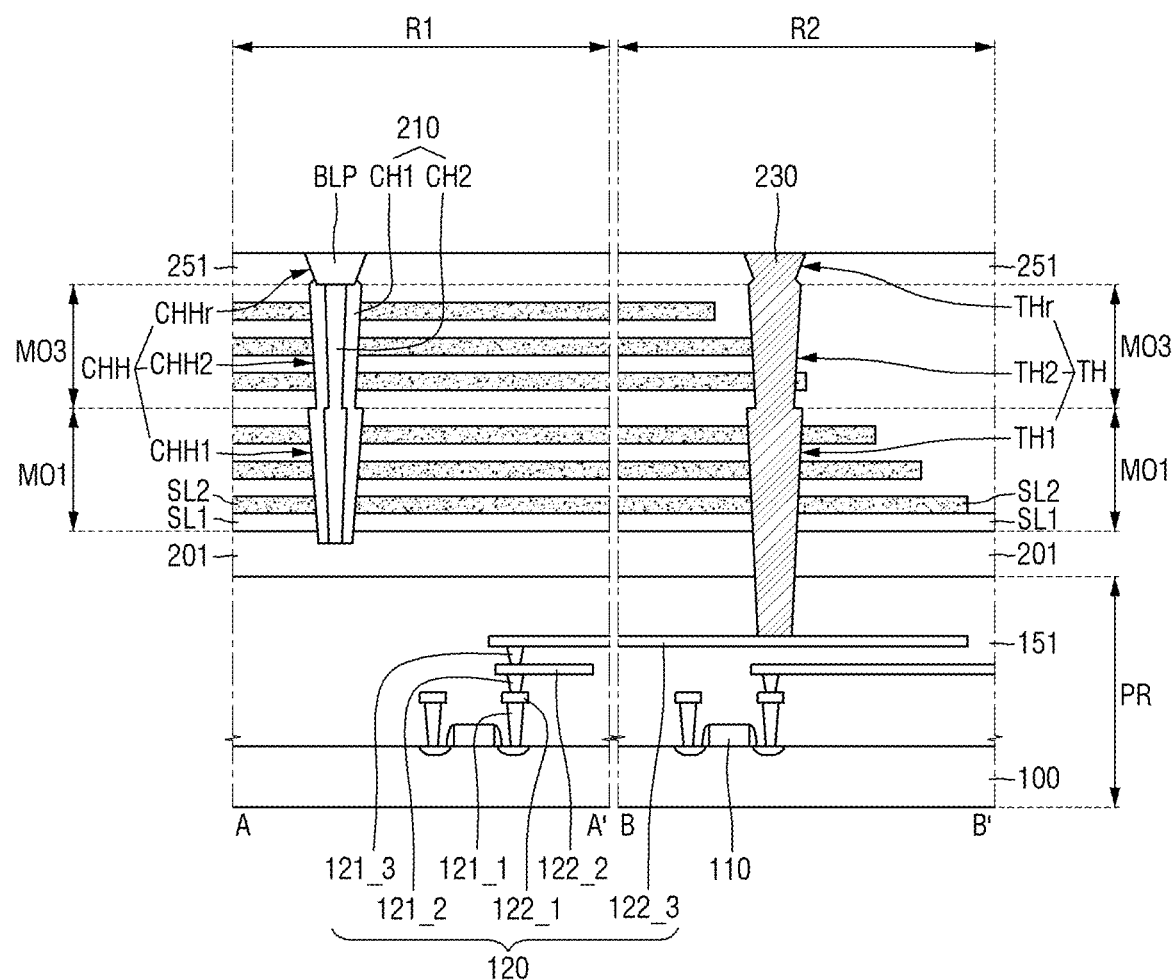

Referring to FIG. 37, the contact 230 may be formed in the second region R2.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor memory device comprising:
a stack structure on a substrate, the stack structure including a plurality of gate electrodes sequentially stacked in a first direction;
a vertical channel structure penetrating the stack structure and extending along the first direction;
a word line contact extending along the first direction and being connected with one of the plurality of gate electrodes; and
a contact penetrating the stack structure between the vertical channel structure and the word line contact, and extending along the first direction,
wherein the vertical channel structure includes a lower vertical channel, and a upper vertical channel on the lower vertical channel,
wherein the contact includes a lower contact portion and a upper contact portion on the lower contact portion,
wherein, at a first boundary between the upper vertical channel and the lower vertical channel, a width of the upper vertical channel in a second direction crossing the first direction is different from a width of the lower vertical channel in the second direction,
wherein at a second boundary between the upper contact portion and the lower contact portion, a width of the upper contact portion in the second direction is different from a width of the lower contact portion in the second direction, and
wherein the first boundary is located on the same vertical level as the second boundary.

2. The semiconductor memory device of claim 1, wherein the plurality of gate electrodes include an uppermost gate electrode disposed on the top of the stack structure, and
wherein the word line contact is connected with the uppermost gate electrode.

3. The semiconductor memory device of claim 1, wherein the contact penetrates through the entire plurality of gate electrodes.

4. The semiconductor memory device of claim 1, further comprising a peripheral circuit region between the stack structure and the substrate,
wherein the peripheral circuit region is a peripheral transistor and a connection wire electrically connected to the peripheral transistor, and
wherein the contact is connected to the connection wire.

5. The semiconductor memory device of claim 4, further comprising an intervening substrate on the peripheral circuit region,
wherein the vertical channel structure is connected to the intervening substrate.

6. The semiconductor memory device of claim 1, wherein the stack structure includes a lower stack structure and an upper stack structure on the lower stack structure, and
wherein the number of the gate electrodes included in the lower stack structure is the same as the number of the gate electrodes included in the upper stack structure.

7. The semiconductor memory device of claim 1, wherein the first boundary and the second boundary is located between an uppermost gate electrode of the lower stack structure and a lowermost gate electrode of the upper stack structure.

8. A semiconductor memory device comprising:
a stack structure on a substrate, the stack structure including a conductive layer and an intervening insulating layers alternatively stacked;
a vertical channel structure penetrating the stack structure and extending along a first direction;

an interlayer insulating layer disposed around the stack structure; and a first contact penetrating the interlayer insulating layer and extending along the first direction, wherein the vertical channel structure includes a lower vertical channel, and a upper vertical channel on the lower vertical channel, wherein the first contact includes a first lower contact portion and a first upper contact portion on the first lower contact portion, wherein, at a first boundary between the upper vertical channel and the lower vertical channel, a width of the upper vertical channel in a second direction crossing the first direction is different from a width of the lower vertical channel in the second direction, wherein at a second boundary between the first upper contact portion and the first lower contact portion, a width of the first upper contact portion in the second direction is different from a width of the first lower contact portion in the second direction, and wherein the first contact does not penetrate the conductive layer.

9. The semiconductor memory device of claim 8, wherein the first boundary is located on the same vertical level as the second boundary.

10. The semiconductor memory device of claim 8, further comprising a peripheral circuit region between the stack structure and the substrate, wherein the peripheral circuit region is a peripheral transistor and a connection wire electrically connected to the peripheral transistor, and wherein the first contact is connected to the connection wire.

11. The semiconductor memory device of claim 10, further comprising an intervening substrate between the peripheral circuit region and the stack structure, wherein the vertical channel structure is connected to the intervening substrate.

12. The semiconductor memory device of claim 8, further comprising a second contact penetrating a least a portion of the stack structure.

13. The semiconductor memory device of claim 8, wherein the second contact includes a second lower contact portion and a second upper contact portion on the second lower contact portion, and wherein at a third boundary between the second upper contact portion and the second lower contact portion, a width of the second upper contact portion in the second direction is different from a width of the second lower contact portion in the second direction.

14. The semiconductor memory device of claim 8, wherein the stack structure includes a lower stack structure and an upper stack structure on the lower stack structure, and wherein the number of the gate electrodes included in the lower stack structure is the same as the number of the gate electrodes included in the upper stack structure.

15. The semiconductor memory device of claim 14, wherein the first boundary and the second boundary is located between an uppermost gate electrode of the lower stack structure and a lowermost gate electrode of the upper stack structure.

16. A semiconductor memory device comprising:

a peripheral circuit region including a peripheral transistor and a connection wire on a substrate, the substrate including a first region, a third region, and a second region between the first region and the third region;

a stack structure disposed over the first region and the second region, the stack structure including a plurality of gate electrodes sequentially stacked in a first direction;

an intervening substrate between the peripheral circuit region and the stack structure;

a vertical channel structure penetrating the stack structure on the first region, and being connected to the intervening substrate;

a first contact penetrating the stack structure on the first region and electrically connected to the connection wire; and a second contact disposed on the third region, and extending along the first direction, and electrically connected to the connection wire, wherein the vertical channel structure includes a lower vertical channel, and a upper vertical channel on the lower vertical channel, wherein the first contact includes a first lower contact portion and a first upper contact portion on the first lower contact portion, wherein the second contact includes a second lower contact portion and a second upper contact portion on the second lower contact portion, wherein, at a first boundary between the upper vertical channel and the lower vertical channel, a width of the upper vertical channel in a second direction crossing the first direction is different from a width of the lower vertical channel in the second direction, wherein at a second boundary between the first upper contact portion and the first lower contact portion, a width of the first upper contact portion in the second direction is different from a width of the first lower contact portion in the second direction, and wherein at a third boundary between the second upper contact portion and the second lower contact portion, a width of the second upper contact portion in the second direction is different from a width of the second lower contact portion in the second direction.

17. The semiconductor memory device of claim 16, wherein the first to third boundaries are located on the same vertical level.

18. The semiconductor memory device of claim 16, further comprising a third contact penetrating the stack structure on the second region and electrically being connected to the connection wire, wherein the third contact includes a third lower contact portion and a third upper contact portion on the third lower contact portion, and wherein at a fourth boundary between the third upper contact portion and the third lower contact portion, a width of the third upper contact portion in the second direction is different from a width of the third lower contact portion in the second direction.

19. The semiconductor memory device of claim 16, wherein the stack structure includes a lower stack structure and an upper stack structure on the lower stack structure, and wherein the number of the gate electrodes included in the lower stack structure is the same as the number of the gate electrodes included in the upper stack structure.

20. The semiconductor memory device of claim 16, further comprising an interfacial insulating layer disposed at an interface between the first contact and the gate electrode.

* * * * *